(12) United States Patent
Nagatomo et al.

(10) Patent No.: US 12,051,604 B2
(45) Date of Patent: Jul. 30, 2024

(54) APPARATUS FOR MANUFACTURING SEMICONDUCTOR DEVICE AND METHOD OF MANUFACTURING SEMICONDUCTOR DEVICE

(71) Applicant: Samsung Electronics Co., Ltd., Suwon-si (KR)

(72) Inventors: Daisuke Nagatomo, Kanagawa (JP);
Fumitaka Moroishi, Kanagawa (JP);
Masanori Izumita, Kanagawa (JP);
Shinji Ueyama, Kanagawa (JP);
Takahiro Tokumiya, Kanagawa (JP);
Takamasa Sugiura, Kanagawa (JP);
Tatsuya Ishimoto, Kanagawa (JP);
Masato Kajinami, Kanagawa (JP)

(73) Assignee: Samsung Electronics Co., Ltd. (KR)

( * ) Notice: Subject to any disclaimer, the term of this patent is extended or adjusted under 35 U.S.C. 154(b) by 400 days.

(21) Appl. No.: 17/544,197

(22) Filed: Dec. 7, 2021

(65) Prior Publication Data

US 2022/0216077 A1    Jul. 7, 2022

(30) Foreign Application Priority Data

Jan. 6, 2021   (JP) ................... 2021-001033
Aug. 6, 2021   (KR) ............. 10-2021-0104205

(51) Int. Cl.
*H01L 21/67*       (2006.01)
*B65G 47/90*       (2006.01)
*H01L 21/68*       (2006.01)

(52) U.S. Cl.
CPC ...... *H01L 21/67144* (2013.01); *B65G 47/905* (2013.01); *H01L 21/681* (2013.01)

(58) Field of Classification Search
CPC ............ H05K 13/0404; H01L 21/681; H01L 21/67144; B32B 37/0046; B32B 38/1825; B32B 2041/04
See application file for complete search history.

(56) References Cited

U.S. PATENT DOCUMENTS 7,044,182 B2   5/2006   Haraguchi
9,431,365 B2   8/2016   Seok et al.
(Continued)

FOREIGN PATENT DOCUMENTS

JP    H11288974 A    10/1999
JP    2005019950 A    1/2005
(Continued)

*Primary Examiner* — Carson Gross
(74) *Attorney, Agent, or Firm* — Myers Bigel, P.A.

(57) ABSTRACT

An apparatus for manufacturing a semiconductor device includes a bonding head configured to adsorb and hold a mounting component at a pick-up position, to move between the pick-up position and a mounting position, and to mount the mounting component on a substrate that is on a bonding stage; a camera configured to move together with the bonding head and to capture an image of the mounting component and an image of the substrate; an optical system configured to transmit light between the mounting component and the camera; a fiducial mark configured to move together with the camera in a capturing range of the camera; and a controller configured to correct a positional relationship between the mounting component and the substrate based on a first image including the fiducial mark and the mounting component and a second image including the fiducial mark and the substrate.

20 Claims, 15 Drawing Sheets

(56) References Cited

U.S. PATENT DOCUMENTS

| | | | |
|---|---|---|---|
| 10,288,413 B2* | 5/2019 | Bilewicz | G01B 11/00 |
| 10,973,158 B2* | 4/2021 | Bilewicz | H05K 13/046 |
| 2012/0268585 A1* | 10/2012 | Markwort | H01L 21/681 |
| | | | 348/87 |
| 2014/0072774 A1* | 3/2014 | Kito | H01L 21/68735 |
| | | | 156/196 |
| 2017/0148759 A1 | 5/2017 | Hayata et al. | |

FOREIGN PATENT DOCUMENTS

| | | |
|---|---|---|
| JP | 2011023424 A | 2/2011 |
| JP | 2011096841 A | 5/2011 |
| JP | 2016063230 A | 4/2016 |
| JP | 2018190958 A | 11/2018 |
| WO | 2015170645 A1 | 11/2015 |

* cited by examiner

APPARATUS FOR MANUFACTURING SEMICONDUCTOR DEVICE AND METHOD OF MANUFACTURING SEMICONDUCTOR DEVICE

CROSS-REFERENCE TO RELATED APPLICATIONS

This application is based on and claims priority under 35 U.S.C. § 119 to Japanese Patent Application No. 2021-001033, filed on Jan. 6, 2021, in the Japan Patent Office, and Korean Patent Application No. 10-2021-0104205, filed on Aug. 6, 2021, in the Korean Intellectual Property Office, the disclosures of which are incorporated by reference herein in their entireties.

BACKGROUND

The inventive concept relates to an apparatus for manufacturing a semiconductor device and a method of manufacturing a semiconductor device.

Recently, multi-layered semiconductor devices have been developed to achieve low power consumption and high driving speed. A manufacturing operation of such semiconductor devices includes a chip bonding operation, which is an operation of stacking a semiconductor chip or mounting a semiconductor package, which referred to as a chip on chip (CoC) or a chip on wafer (CoW). The chip bonding operation is changing from a wire bonding technology to a connection method by a flip chip or a through silicon via (TSV). In the wire bonding technology, the bonding precision of several tens of micrometers ($\mu m$) was sufficient, but in flip chip bonding where a bump and a pad are in a direct contact, a precision of several $\mu m$, and especially in TSV chip bonding, sub-$\mu m$ precision is required. In addition, because metals are directly bonded in the chip bonding operation, there is a tendency to use high temperature and high pressure during bonding. Accordingly, in a chip bonding apparatus having high precision, a minute change in a mechanical/thermal structure becomes a factor impairing the precision.

SUMMARY

The inventive concept provides an apparatus for manufacturing a semiconductor device, the apparatus having high precision, and a method of manufacturing a semiconductor device using the apparatus.

According to an aspect of the inventive concept, there is provided an apparatus for manufacturing a semiconductor device, including: a bonding head configured to adsorb and hold a mounting component at a pick-up position, to move between the pick-up position and a mounting position, and to mount the mounting component on a substrate that is on a bonding stage; a camera configured to move together with the bonding head, to capture an image of the mounting component held by the bonding head, and to capture an image of the substrate that is on the bonding stage; an optical system configured to transmit light between the mounting component and the camera so that the image of the mounting component held by the bonding head is captured by the camera; a fiducial mark configured to move together with the camera in a capturing range of the camera; and a controller configured to correct a positional relationship between the mounting component and the substrate based on a first image including the fiducial mark and the mounting component and a second image including the fiducial mark and the substrate, wherein the first image is obtained by capturing an image of the mounting component by the camera through the optical system, and the second image is obtained by capturing an image of the substrate by the camera.

According to another aspect of the inventive concept, there is provided an apparatus for manufacturing a semiconductor device, including: a bonding head configured to adsorb and hold a semiconductor chip at a pick-up position, to move between the pick-up position and a mounting position, and to mount the semiconductor chip on a substrate that is on a bonding stage; a camera configured to move together with the bonding head, to capture an image of the semiconductor chip held by the bonding head, and to capture an image of the substrate that is on the bonding stage; an optical system configured to transmit light between the semiconductor chip and the camera so that the image of the semiconductor chip held by the bonding head is captured by the camera; and a controller configured to correct a positional relationship between the semiconductor chip and the substrate based on a first image of the semiconductor chip and a second image of the substrate, wherein the first image is obtained by capturing an image of the semiconductor chip by the camera through the optical system, and the second image is obtained by capturing an image of the substrate directly by the camera.

According to another aspect of the inventive concept, there is provided an apparatus for manufacturing a semiconductor device, including: a bonding head configured to adsorb and hold a mounting component at a pick-up position, to move between the pick-up position and a mounting position, and to mount the mounting component on a substrate on a bonding stage; a camera configured to move together with the bonding head, to capture an image of the mounting component held by the bonding head, and to capture an image of the substrate on the bonding stage; and a fiducial mark configured to move together with the camera and in a capturing range of the camera when the camera captures the image of the mounting component held by the bonding head and when the camera captures the image of the substrate on the bonding stage.

According to another aspect of the inventive concept, there is provided a method of manufacturing a semiconductor device, including: holding, by a bonding head, a mounting component at a pick-up position; carrying the mounting component held by the bonding head to a capturing position; capturing an image of the mounting component held by the bonding head by using a camera configured to move together with the bonding head; capturing an image of a substrate that is on a bonding stage by using the camera; and mounting the mounting component on the substrate, wherein the camera is configured to capture the image of the mounting component through an optical system while the camera captures the image of the mounting component held by the bonding head, a fiducial mark configured to move together with the camera is provided in a capturing range of the camera while the camera captures the image of the mounting component held by the bonding head and captures the image of the substrate that is on the bonding stage, and a positional relationship between the mounting component and the substrate is corrected based on a first image including the fiducial mark and the mounting component and a second image including the fiducial mark and the substrate, wherein the first image is obtained by capturing an image of the mounting component by the camera through the optical system, and the second image is obtained by capturing an image of the substrate by the camera.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
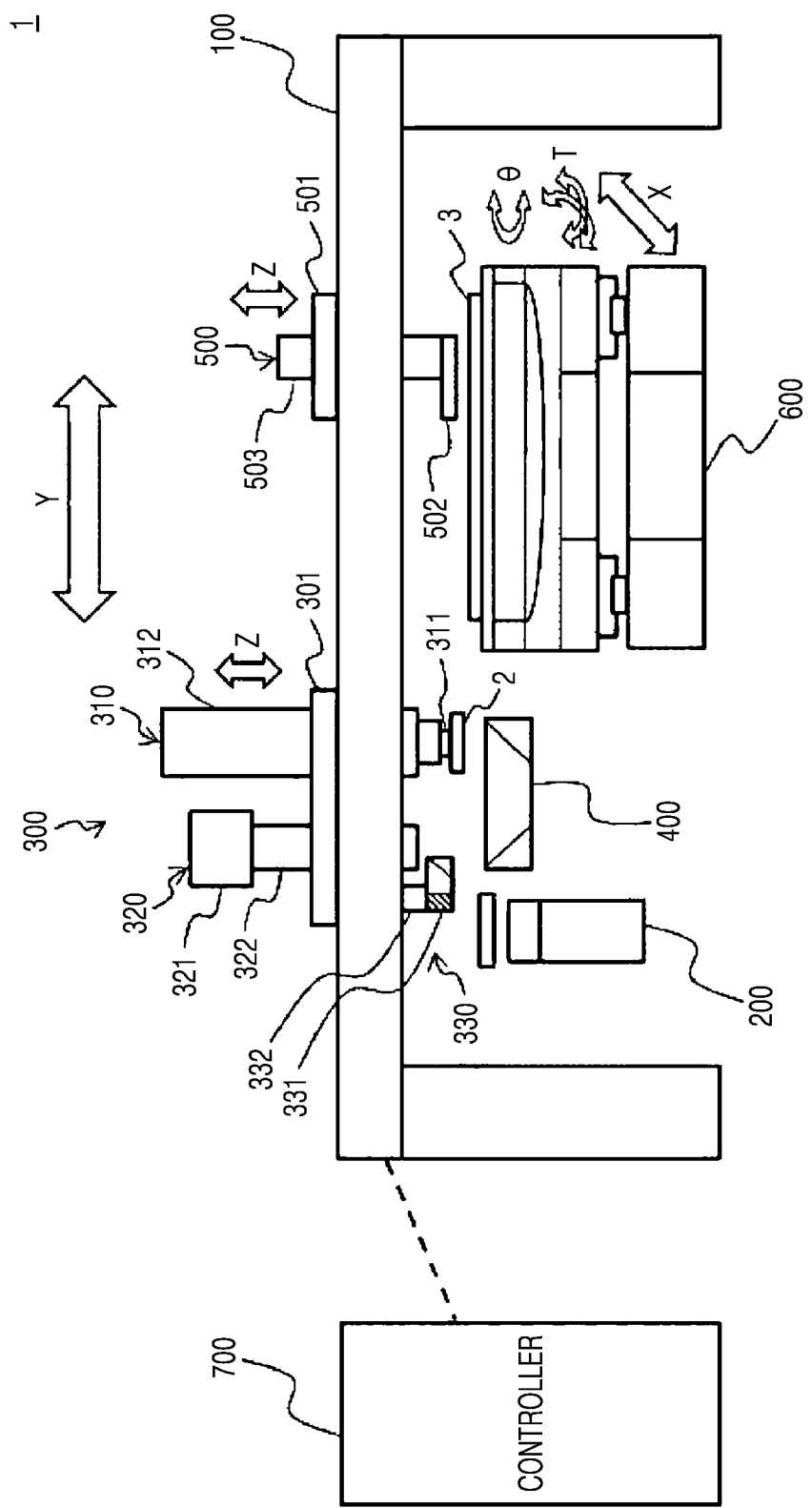
FIG. 1 is a schematic configuration diagram of an apparatus for manufacturing a semiconductor device, according to example embodiments of the inventive concept.

Hereinafter, embodiments of the inventive concept will be described in detail with reference to the accompanying drawings. Like reference numerals refer to like elements throughout and description thereof will not be given.

FIG. 1 is a schematic configuration diagram of an apparatus 1 for manufacturing a semiconductor device, according to example embodiments of the inventive concept.

Referring to FIG. 1, the apparatus 1 for manufacturing a semiconductor device may include a mounting apparatus (or bonding apparatus) such as a chip bonding apparatus or a die bonding apparatus. The apparatus 1 may be configured to mount (or bond) a mounting component such as a semiconductor chip 2 on or to a substrate 3. For example, the semiconductor chip 2 may be a chip having a rectangular flat plate shape as an example of a mounting component, or other electronic components such as a chip. For example, the substrate 3 may be a semiconductor substrate having a rectangular flat plate shape or a semiconductor wafer including a rectangular mounting area as an example of a component to be mounted. The substrate 3 on which the semiconductor chip 2 (that is, the mounting component) is mounted may also include a semiconductor chip manufactured by cutting from a semiconductor wafer, or a wafer substrate before cutting.

Hereinafter, a Z-axis direction may mean a mounting direction in which the semiconductor chip 2 is mounted on the substrate 3, and a Y-axis direction may mean a carrying direction of carrying the semiconductor chip 2 from a pickup position to a mounting position on the substrate 3. In addition, an X-axis direction may mean a direction crossing the Y-axis direction and perpendicular to the Z-axis direction. In the Z-axis direction (that is, the mounting direction), a direction from the substrate 3 toward the semiconductor chip 2 may be referred to as an upper side or upper direction of the Z-axis direction, and a direction from the semiconductor chip 2 toward the substrate 3 may be referred to a lower side or lower direction of the Z-axis direction. In addition, in the Y-axis direction (that is, the carrying direction), a direction from the mounting position toward the pickup position may be referred to as a left side or left direction of the Y-axis direction, and a direction from the pickup position toward the mounting position may be referred to as a right side or right direction of the Y-axis direction.

As shown in FIG. 1, the apparatus 1 may include a base 100, a flip chip unit or system 200, a chip carrying unit or system 300, an optical unit or system 400, a measuring apparatus 500, and a bonding stage 600, and may also include a controller 700 configured to control an operation of the apparatus 1.

The base 100 may support components of the apparatus 1. For example, the base 100 may support the flip chip unit 200 and the optical unit 400 to be fixed on a certain position. Also, the base 100 may support the chip carrying unit 300, the measuring apparatus 500, and the bonding stage 600 to be movable.

The flip chip unit 200 may pick up the semiconductor chip 2 from a semiconductor wafer and flip the semiconductor chip 2 such that the top and bottom of the semiconductor chip 2 are inverted. The flip chip unit 200 may rotate the semiconductor chip 2 such that the top and bottom of the semiconductor chip 2 are inverted. For example, the flip chip unit 200 may include a chip picker for picking up the semiconductor chip 2 supplied from the semiconductor wafer. The flip chip unit 200 may adsorb and hold the semiconductor chip 2. In addition, the flip chip unit 200 may rotate while holding the semiconductor chip 2 to invert the top and bottom of the semiconductor chip 2. The flip chip unit 200 may rotate the semiconductor chip 2 such that a mounting surface (or a surface having external pads or external terminals) of the semiconductor chip 2, which is picked up, faces the lower side of the Z-axis direction (or faces downward).

The chip carrying unit 300 may carry the semiconductor chip 2 to the right side of the Y-axis direction such that the semiconductor chip 2 picked up by the flip chip unit 200 is positioned on the bonding stage 600, and the semiconductor chip 2 may also be moved in the lower side of the Z-axis direction (or downward) so that the semiconductor chip 2 may be mounted on the substrate 3.

After receiving the semiconductor chip 2 from the flip chip unit 200, the chip carrying unit 300 may move to the top of the optical unit 400 and capture an image of the semiconductor chip 2 by using the optical unit 400, capture an image of the substrate 3 on the bonding stage 600, and also mount the semiconductor chip 2 on the substrate 3.

Figure 2:
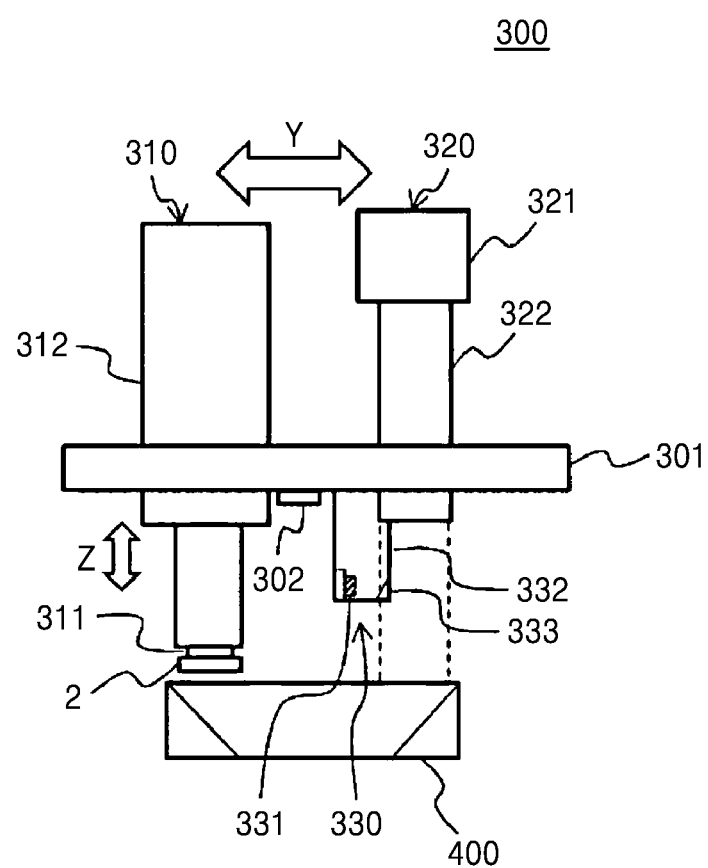
FIG. 2 is a configuration diagram of a chip carrying unit.
Figure 3:
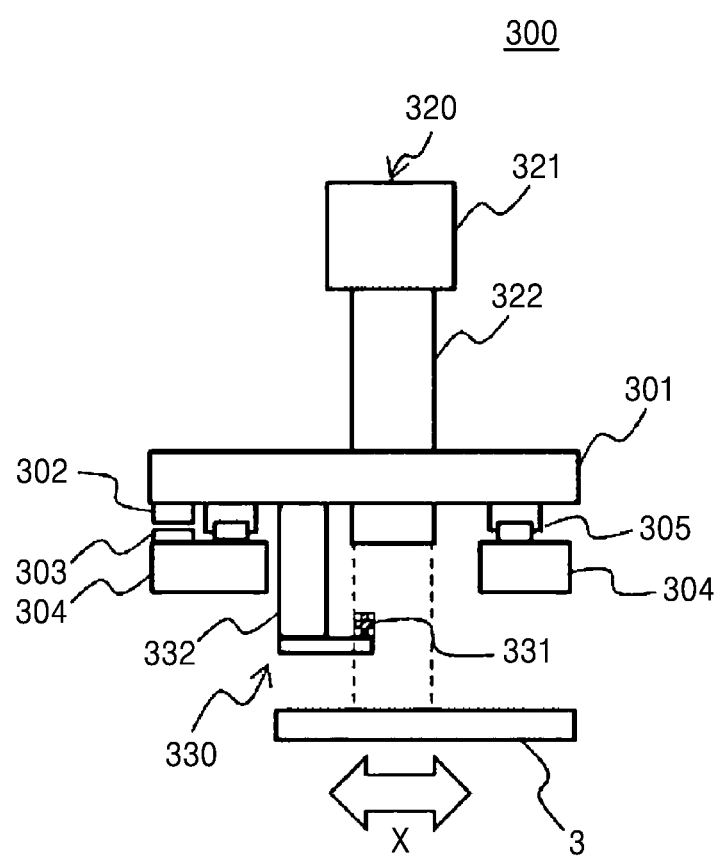
FIG. 3 is configuration diagram of a chip carrying unit.

FIGS. 2 and 3 are configuration diagrams of the chip carrying unit 300.

Referring to FIGS. 2 and 3, the chip carrying unit 300 may include a Y-axis slider 301, a bonding head or bonding head system 310, a vision head or vision head system 320, and a fiducial mark arrangement unit or system 330. The Y-axis slider 301 is a moving unit movable in the Y-axis direction, and may include, for example, a slider having a gantry structure. The bonding head 310, the vision head 320, and the fiducial mark arrangement unit 330 may be fixed to the Y-axis slider 301. The Y-axis slider 301 may move the bonding head 310, the vision head 320, and the fiducial mark arrangement unit 330 simultaneously in the Y-axis direction.

A Y-axis linear encoder 302 for obtaining Y-axis coordinates may be mounted on the Y-axis slider 301. The Y-axis linear encoder 302 may be referred to as a movement distance detector. The Y-axis slider 301 may be arranged on a gantry frame 304 through a linear guide 305 provided on the gantry frame 304. A Y-axis scale 303 extending in the Y-axis direction may be provided on the gantry frame 304. The Y-axis slider 301 may move on the Y-axis scale 303 in the Y-axis direction, and the Y-axis linear encoder 302 may obtain Y-axis coordinates from the Y-axis scale 303.

The bonding head 310 is a bonding unit or system for adsorbing and holding the semiconductor chip 2, and bonding (mounting) the held semiconductor chip 2 on the substrate 3 after moving a certain distance. The bonding head 310 may receive and hold the semiconductor chip 2 from the flip chip unit 200, and may move the held semiconductor chip 2 in the Z-axis direction to bond the held semiconductor chip 2 with the substrate 3.

The bonding head 310 may include an adsorbing head 311 and a bonding picker 312. The adsorbing head 311 is, for example, an adsorbing pad formed on an end portion of the bonding picker 312, and may adsorb and hold the semiconductor chip 2. The bonding picker 312 may move the adsorbing head 311 holding the semiconductor chip 2 in the Z-axis direction. For example, the bonding picker 312 may be fixed and connected to the Y-axis slider 301, and the bonding head 310 may move in the Y-axis direction.

The vision head 320 may be mounted on the Y-axis slider 301 to move together with the bonding head 310. The vision head 320 is a capturing unit for capturing and observing images of the semiconductor chip 2 and the substrate 3. The vision head 320 may capture an image of the semiconductor chip 2 through the optical unit 400. In addition, the vision head 320 may capture an image of the substrate 3 on the bonding stage 600. The vision head 320 may include a camera 321 and a camera lens 322. The camera 321 may include a capturing device (capturing unit) such as a charge coupled device (CCD), a complementary metal oxide semiconductor (CMOS) sensor, or the like. For example, only one camera 321 may be used from the pickup of the semiconductor chip 2 to the bonding between the semiconductor chip 2 and the substrate 3, and an image of the semiconductor chip 2 and an image of the substrate 3 may be captured by using one camera 321 to obtain position information of the semiconductor chip 2 and the substrate 3. When the bonding head 310 holds the semiconductor chip 2, the camera 321 may capture the image of the held semiconductor chip 2 through the optical unit 400 and obtain position information of the semiconductor chip 2. In addition, when the semiconductor chip 2 is mounted on the substrate 3, the camera 321 may capture the image of the substrate 3 arranged on the bonding stage 600 to obtain position information on a particular area of the substrate 3 on which the semiconductor chip 2 is mounted. The camera 321 may set a direction from the upper side toward the lower side of the Z-axis direction as a capturing direction, and the camera lens 322 is oriented toward the capturing direction. The camera lens 322 is an optical system mounted on the camera 321, and may include, for example, a telecentric lens. For example, the vision head 320 may be fixed and connected to the Y-axis slider 301, and the vision head 320 may move in the Y-axis direction.

The fiducial mark arrangement unit 330 may include a fiducial mark 331. The fiducial mark 331 is a mark indicating a fiducial position for correcting a position and a posture of each of the semiconductor chip 2 and the substrate 3.

The fiducial mark arrangement unit 330 includes the fiducial mark 331, a mark fixing part 332, and a mirror 333. The fiducial mark 331 may be configured to move together with the camera 321. From the time of picking up the semiconductor chip 2 to the time of bonding the same to the substrate 3, the fiducial mark 331 may be included within a field of view (that is, a capturing range) of the camera 321, and may be arranged in a position in which an image thereof is always able to be captured by the camera 321. The fiducial mark 331 is held by a structure in which a relative positional variation with the Y-axis linear encoder 302 for grasping a Y-coordinate of the camera 321 is sufficiently suppressed. That is, the fiducial mark 331 may be fixed at a certain position so that a distance from the Y-axis linear encoder 302 does not change (that is, a relative position to the Y-axis linear encoder 302 becomes constant). For example, the mark fixing part 332 may be arranged at a position at a certain distance from the Y-axis linear encoder 302, and the fiducial mark 331 may be arranged on an end of the mark fixing part 332. For example, the mark fixing part 332 extends from the Y-axis slider 301 in the Z-axis direction, and the fiducial mark 331 arranged on the mark fixing part 332 moves in the Y-axis direction together with the mark fixing part 332. The mirror 333 may be arranged on an optical path of the camera 321, and may branch an optical path from a portion of the field of view of the camera 321 so that an image of the fiducial mark 331 may be captured by the camera 321. In addition, an auxiliary lighting device for illuminating the fiducial mark 331 may be included. The auxiliary lighting device may include at least one light source. For example, the auxiliary lighting device may illuminate the fiducial mark 331 from a back side. The auxiliary lighting device may be controlled independently of a lighting for capturing the semiconductor chip 2.

Figure 4:
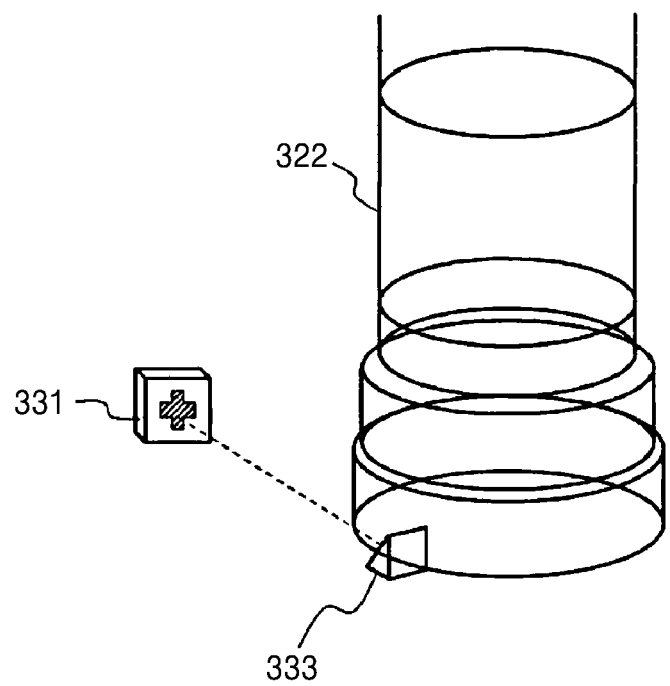
FIG. 4 is a configuration diagram of a fiducial mark and a mirror.
Figure 5:
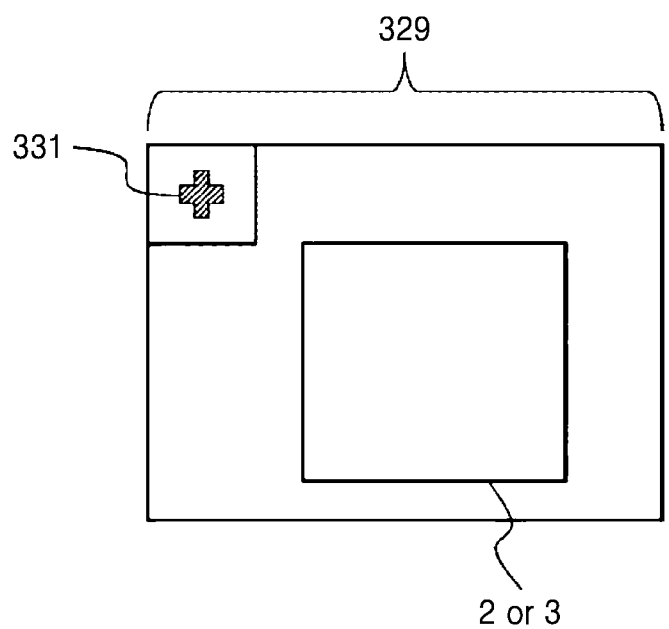
FIG. 5 is a schematic diagram showing an image including a fiducial mark captured by a camera.

FIG. 4 is a configuration diagram of the fiducial mark 331 and the mirror 333. FIG. 5 is a schematic diagram showing an image including the fiducial mark 331 captured by the camera 321.

Referring to FIGS. 4 and 5, the mirror 333 may be mounted on an end of the camera lens 322, and the camera lens 322 may capture the image of the fiducial mark 331 through the mirror 333. The fiducial mark 331 is arranged at a position spaced apart from the camera 321 by a certain distance. In particular, the fiducial mark 331 may be arranged at a position that becomes a focal length of the camera 321. For example, as shown in FIG. 5, a field of view 329 of the camera 321 may include an image of a bottom surface of the semiconductor chip 2 or an image of the substrate 3, and an image of the fiducial mark 331. That is, an image obtained by capturing, by the camera 321, the semiconductor chip 2 held by the bonding head 310 may include the semiconductor chip 2 and the fiducial mark 331, and an image obtained by capturing, by the camera 321, the substrate 3 mounted on the bonding stage 600 may include the substrate 3 and the fiducial mark 331. In FIG. 5, the fiducial mark 331 is illustrated in an upper left portion of the field of view 329 of the camera 321 as an example, but may be at other positions in the field of view 329 of the camera 321 as long as a fiducial position may be indicated. In addition, the fiducial mark 331 is illustrated as a cross mark as an example, but may be a round mark or a mark having other arbitrary shape as long as a reference position may be indicated.

Referring back to FIGS. 1 and 2, the optical unit 400 may include an optical system adjusting the optical path of the camera 321. In example embodiments, while the bonding head 310 picks up and holds the semiconductor chip 2, the camera 321 may capture an image of the mounting surface of the semiconductor chip 2 through the optical unit 400. A position error of the semiconductor chip 2 may be detected by using an image obtained by capturing the semiconductor chip 2 supported by the bonding head 310.

The camera 321 of the vision head 320 is arranged to capture an image in the same direction (that is, the Z-axis direction) as the mounting direction of the bonding head 310, and the optical unit 400 enables the camera 321 to capture the mounting surface opposite to an adsorbing surface of the semiconductor chip 2 adsorbed by the bonding head 310. The optical unit 400 may enable the camera 321 to capture the mounting surface in a direction from the lower side to the upper side in the Z-axis direction. The optical unit 400 may be fixed to the base 100 and may be or may not be connected to an actuator. The optical unit 400 may be arranged below a movement path of the chip carrying unit 300 in the Y-axis direction, wherein the movement path of the chip carrying unit 300 may be extending from the flip chip unit 200 to the bonding stage 600. The flip chip unit 200 picks up the semiconductor chip 2 at a pick-up position, and also the optical unit 400 may be arranged near the pick-up position of the flip chip unit 200 to capture the image of the semiconductor chip 2 held by the bonding head 310. An optical system inside the optical unit 400 may include a telecentric relay optical system, and may transmit an image of the bottom surface of the semiconductor chip 2 with the same optical performance as when an image is captured directly from below by the camera 321. The optical unit 400 may include a prism and/or a telecentric feature to transmit light or images. In addition, the optical unit 400 may be implemented with an optical system other than a telecentric system by designing the camera lens 322 mounted on the camera 321 and the optical unit 400 exclusively. In example embodiments, the optical unit 400 may also include an optical system having a variable optical magnification. For example, the optical unit 400 may include an optical system capable of adjusting an optical magnification as necessary.

Figure 6:
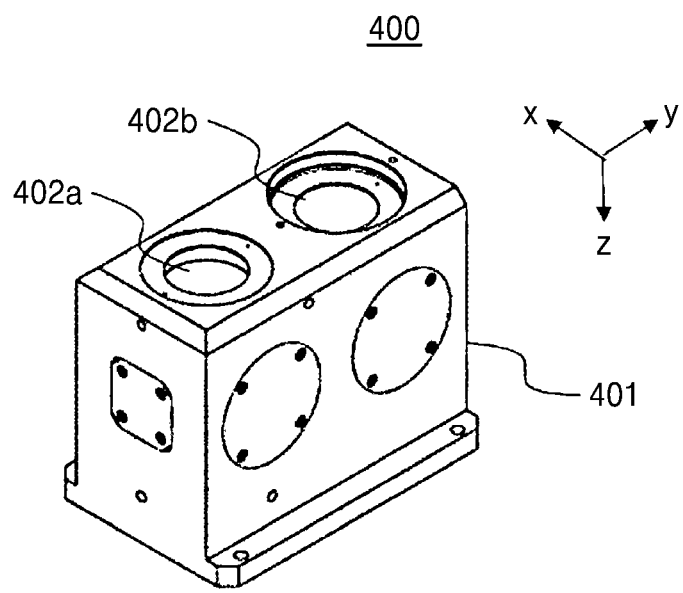
FIG. 6 is a perspective view of an external appearance of an optical unit.
Figure 7:
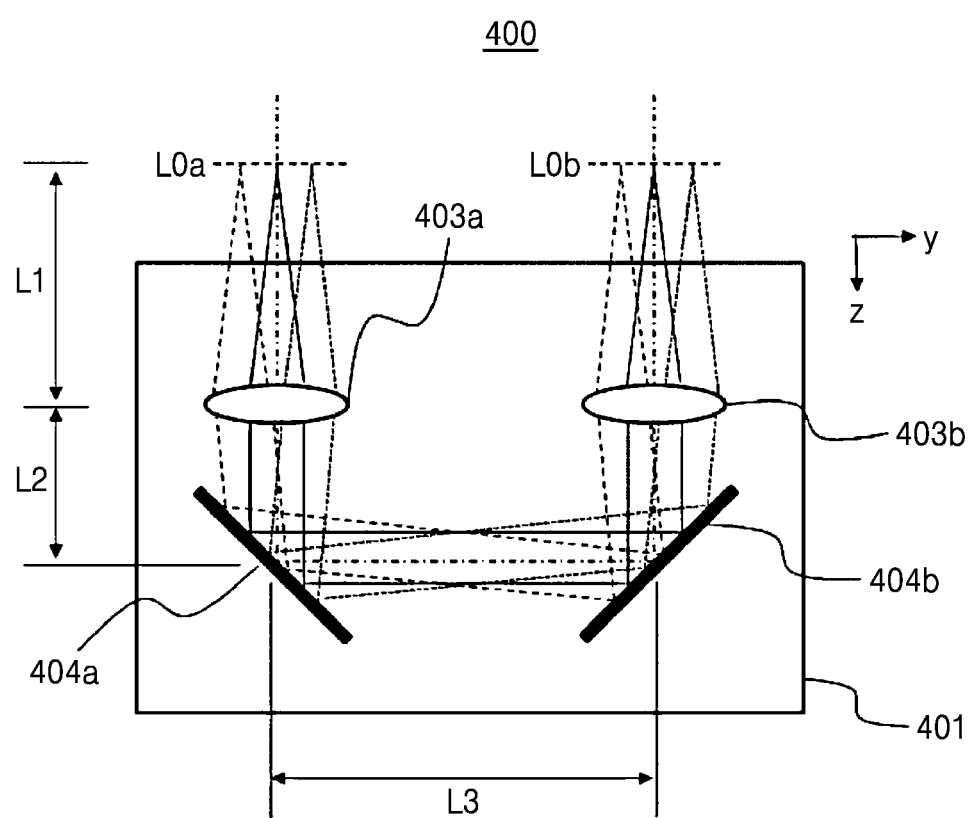
FIG. 7 is a configuration diagram of an internal optical system of an optical unit.

FIG. 6 is a perspective view of an external appearance of the optical unit 400. FIG. 7 is a configuration diagram of an internal optical system of the optical unit 400.

As shown in FIG. 6, the optical unit 400 may include a case 401 forming the external appearance of the optical unit 400, and a first opening 402a and a second opening 402b formed in the case 401. The case 401 may include an optical system therein, and may have, for example, a substantially rectangular parallelepiped shape. The first and second openings 402a and 402b may be provided on an upper surface (input/output surface) of the case 401, and, for example, may have the same circular shape as first and second lenses 403a and 403b provided inside the case 401. The first and second openings 402a and 402b may correspond to first and second incident/emission units (input/output units) for making light or an image to be incident/emitted to an internal optical system. For example, one of the first and second openings 402a and 402b is an incident unit for incident light, and the other is an emission unit for emitting light. For example, the first and second openings 402a and 402b are respectively formed in the vicinity of both ends of the upper surface of the case 401 in a longitudinal direction. However, the first and second openings 402a and 402b may also be formed at other arbitrary positions according to the structure and arrangement of the optical system therein.

As shown in FIG. 7, the optical unit 400 may include a first lens 403a, a second lens 403b, a first mirror 404a, and a second mirror 404b, as the internal optical system. For example, the first and second lens 403a and 403b are convex lenses of the same characteristic, and the first and second mirrors 404a and 404b are total reflection mirrors of the same characteristic. The first and second lens 403a and 403b may have the same height or be at the same vertical position in the Z-axis direction, and the first and second mirrors 404a and 404b may have the same height or be at the same vertical position in the Z-axis direction. The first mirror 404a may be arranged below the first lens 403a in the Z-axis direction, and similarly, the second mirror 404b may be arranged below the second lens 403b in the Z-axis direction. The first lens 403a and the first mirror 404a may be on an incident side (object side) of light, and the second lens 403b and the second mirror 404b may be on an emission side (capturing side). Alternatively, the first lens 403a and the first mirror 404a may be on the emission side (capturing side), and the second lens 403b and the second mirror 404b may be on the incident side (object side) of light. For example, in a case where the first lens 403a and the first mirror 404a are on the incident side (object side) of light, when light is incident on the first lens 403a in the lower side of the Z-axis direction (or downward), light passing through the first lens 403a is tilted 90° by the first mirror 404a and reflected to the right side of the Y-axis direction (or to the right), the light reflected by the first mirror 404a is tilted 90° by the second mirror 404b and reflected in the upper side of the Z-axis direction (or upward), and the light reflected by the second mirror 404b is emitted by passing through the second lens 403b.

For example, a height or vertical position L0a of an object in the Z-axis direction and a height or vertical position L0b of an image in the Z-axis direction are equal to each other, and let L1 be a distance in the Z-axis direction from the object to the first lens 403a and a distance in the Z-axis direction from the image to the second lens 403b, respectively, let L2 be a distance in the Z-axis direction from the first lens 403a to the first mirror 404a and a distance in the Z-axis direction from the second lens 403b to the second mirror 404b, respectively, and let L3 be a distance in the Y-axis direction between the first mirror 404a and the second mirror 404b. In this case, a relationship of "L1=L2+ 0.5*L3=a focal length of each of the first lens 403a and the second lens 403b" is established, and a bidirectional telecentric optical system may be configured. In addition, L3 may be a distance in the Y-axis direction between the object and the image, and may also be a distance between a center of the bonding head 310 and a center of the vision head 320. A positional relationship of the bonding head 310 and the vision head 320 (or a positional relationship of the bonding head 310 and the camera 321) may correspond to a positional relationship of the first lens 403a and the second lens 403b or a positional relationship of the first opening 402a and the second opening 402b. In other words, a positional relationship of the bonding head 310 and the vision head 320 (or a positional relationship of the bonding head 310 and the camera 321) may correspond to a pitch between an optical axis of the first lens 403*a* and an optical axis of the second lens 403*b*.

Figure 8:
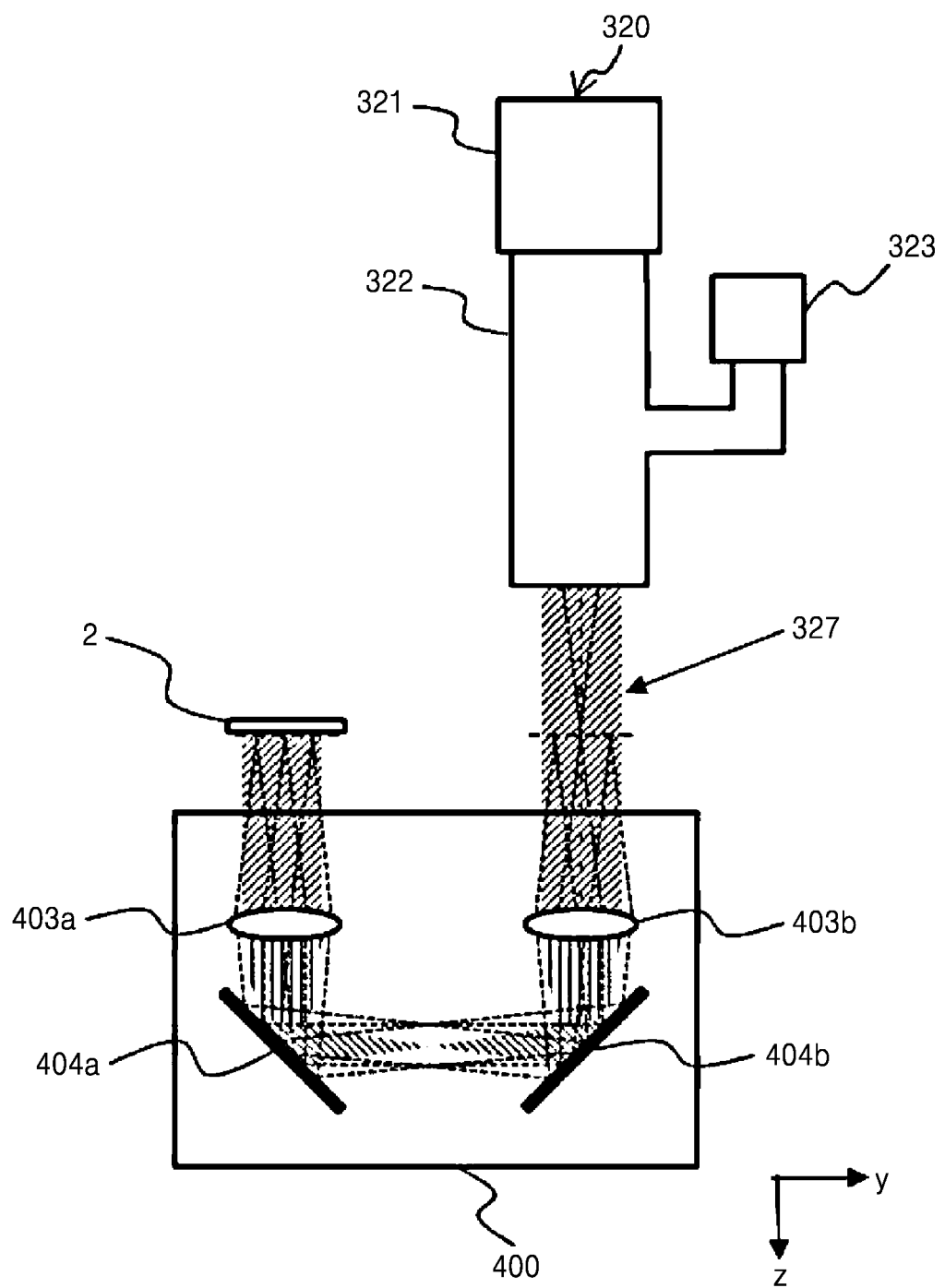
FIG. 8 is a configuration diagram showing an operation of capturing a semiconductor chip by using an optical unit.
Figure 9:
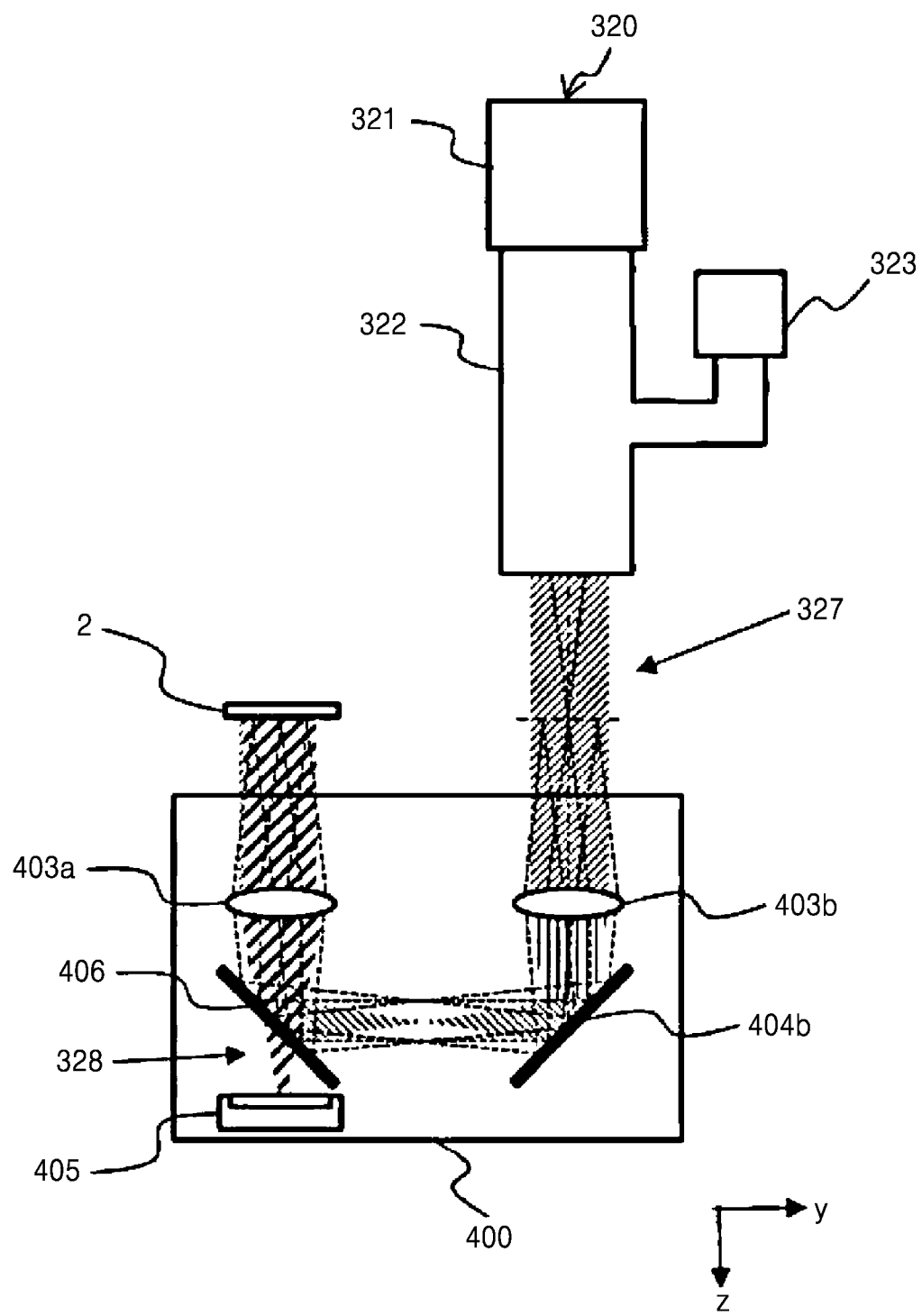
FIG. 9 is a configuration diagram showing an operation of capturing a semiconductor chip by using an optical unit.

FIGS. 8 and 9 are each a configuration diagram illustrating an operation of capturing the semiconductor chip 2 by using the optical unit 400.

Referring to FIG. 8, the vision head 320 may include an illumination light source 323 that illuminates in a capturing direction. The illumination light source 323 may include, for example, a falling illumination light source, a coaxial illumination light source, or the like. For example, the illumination light source 323 may be mounted on the camera lens 322, and the semiconductor chip 2 may be illuminated by using the illumination light source 323 while the image of the semiconductor chip 2 is being captured through the optical unit 400. When illumination light 327 is emitted from the illumination light source 323 from the top to the bottom in the Z-axis direction through the camera lens 322, the semiconductor chip 2 may be illuminated through the first lens 403*a*, the first mirror 404*a*, the second mirror 404*b*, and the second lens 403*b* of the optical unit 400.

In addition, referring to FIG. 9, an additional light 328 adding brightness to the illumination light 327 from the illumination light source 323 may be provided. For example, the additional light 328 may be provided by an auxiliary light source 405 arranged inside the optical unit 400. The brightness of an image of the semiconductor chip 2 may be improved by auxiliary illumination of the semiconductor chip 2 by the auxiliary light source 405. For example, the first mirror (see 404*a* of FIG. 8) provided in the optical unit 400 may be replaced by a beam splitter 406 having the same transmittance and reflectance. The semiconductor chip 2 may be illuminated from the lower side to the upper side in the Z-axis direction from the auxiliary light source 405 through the beam splitter 406.

Figure 10:
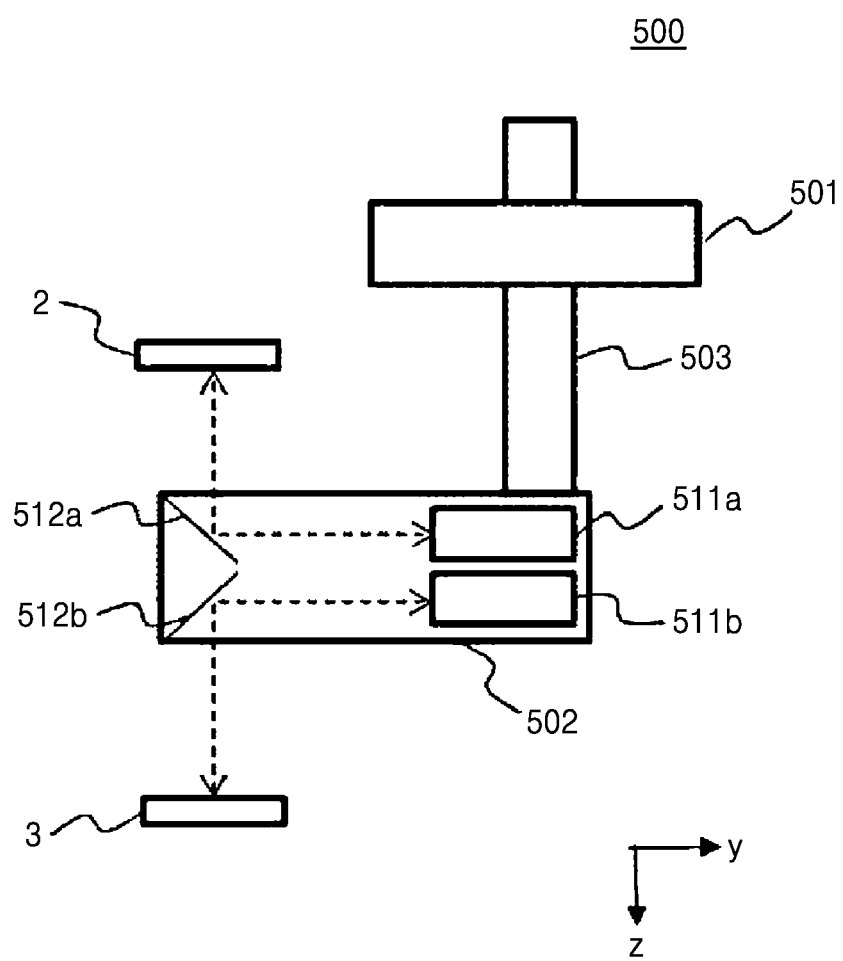
FIG. 10 is a configuration diagram of a measuring apparatus.

FIG. 10 is a configuration diagram of the measuring apparatus 500.

Referring FIG. 10 together with FIG. 1, the measuring apparatus 500 may be configured to measure inclination information and distance information of a measurement target (that is, the semiconductor chip 2 and/or the substrate 3). For example, the measuring apparatus 500 may be configured to measure an inclination and/or a height in the Z-axis direction of a measurement target of the semiconductor chip 2 and/or the substrate 3. For example, the measuring apparatus 500 may include a collimator, an auto-collimator, a distance sensor, or the like. The measuring apparatus 500 may be configured to move in the Y-axis direction. The movement of the measuring apparatus 500 in the Y-axis direction and the movement of the chip carrying unit 300 in the Y-axis direction may be controlled independently.

The measuring apparatus 500 may include a Y-axis slider 501, a measurement unit or system 502, and a Z-axis slider 503.

The Y-axis slider 501 is a moving unit movable in the Y-axis direction similar to the Y-axis slider 301 of the chip carrying unit 300. The y-axis slider 501 may support the measurement unit 502 and the Z-axis slider 503. The measurement unit 502 and the Z-axis slider 503 may be fixed to the y-axis slider 501. The y-axis slider 501 may move the measurement unit 502 and the Z-axis slider 503 in the Y-axis direction. The measurement unit 502 may measure the inclination information and/or distance information of each of the semiconductor chip 2 and the substrate 3 by using a laser beam.

The Z-axis slider 503 may move the measurement unit 502, which is fixed to an end portion of the Z-axis slider 503, in the Z-axis direction. In addition, the configuration of the measuring apparatus 500 is an example, and in some cases, the Z-axis slider 503 may not be provided, and a position of the measurement unit 502 may be or may not be fixed in the Z-axis direction.

The measurement unit 502 includes a first light emitting and light receiving device 511*a*, a second light emitting and light receiving device 511*b*, a first mirror 512*a*, and a second mirror 512*b*. Each of the first and second light emitting and light receiving devices 511*a* and 511*b* may include a light source for irradiating a laser beam and a light receiving device for receiving reflected light.

The first light emitting and light receiving device 511*a* and the first mirror 512*a* may be provided to perform measurement on the semiconductor chip 2. For example, a light emitting device of the first light emitting and light receiving device 511*a* emits a laser beam from the right side to the left side in the Y-axis direction, the emitted laser beam may be bent 900 by the first mirror 512*a* to travel from the lower side to the upper side in the Z-axis direction to be irradiated on the semiconductor chip 2. Also, reflected light reflected by the semiconductor chip 2 may travel from the upper side to the lower side in the Z-axis direction and be reflected by the first mirror 512*a* to travel from the left side to the right side in the Y-axis direction to be received by the light receiving device of the first light emitting and light receiving device 511*a*. An inclination or distance of the semiconductor chip 2 may be measured based on an intensity or the like of the received reflected light.

The second light emitting and light receiving device 511*b* and the second mirror 512*b* may be provided to perform measurement on the substrate 3. When a light emitting device of the second light emitting and light receiving device 511*b* emits a laser beam from the right side to the left side in the Y-axis direction, the emitted laser beam may be bent 900 by the second mirror 512*b* to travel from the upper side to the lower side in the Z-axis direction to be irradiated on the substrate 3. Also, reflected light reflected by the substrate 3 may travel from the lower side to the upper side in the Z-axis direction and be reflected by the second mirror 512*b* to travel from the left side to the right side in the Y-axis direction to be received by the light receiving device of the second light emitting and light receiving device 511*b*. An inclination and a distance of the substrate 3 may be measured based on an intensity of the received reflected light.

Referring FIGS. 1 to 5, the bonding stage 600 may movably mount the substrate 3 to be bonded. The bonding stage 600 may move in the X-axis direction and/or the Y-axis direction to designate a bonding position of the semiconductor chip 2. In addition, the bonding stage 600 may rotate in a rotation direction (e.g., θ direction) having a rotation axis (e.g., θ-axis) that is parallel to the Z-axis direction. In addition, the bonding stage 600 may rotate in a rotation direction (e.g., Tx direction) having a rotation axis (e.g., Tx-axis) that is parallel to the X-axis direction, and may be configured to rotate in a rotation direction (e.g., Ty direction) having as a rotation axis (e.g., Ty-axis) that is parallel to the Y-axis direction. The bonding stage 600 may be driven based on a correction value calculated based on angle information in the θ-axis and position information of the semiconductor chip 2 obtained by the camera 321, angle information in the θ-axis and position information of the substrate 3 obtained by the camera 321, height information and inclination information of the semiconductor chip 2 obtained by the measuring apparatus 500, and/or height information and inclination information of the substrate 3 obtained by the measuring apparatus 500, thereby correcting a bonding position between the semiconductor chip 2 and the substrate 3.

The controller 700 may control an operation of each component included in the apparatus 1, and may control the overall bonding operation of the apparatus 1. The controller 700 may be implemented in, for example, a computer device such as a personal computer or a server that executes a control program. For example, the controller 700 may include a memory device such as read only memory (ROM) and random access memory (RAM), and a processor configured to perform a certain operation and algorithm, for example, a microprocessor, a central processing unit (CPU), a graphics processing unit (GPU), etc. In addition, the controller 700 may include a receiver and a transmitter for receiving and transmitting an electrical signal.

The controller 700 may control movements of the chip carrying unit 300 and the measuring apparatus 500, obtain images (or position information) of the semiconductor chip 2 and the substrate 3 using the camera 321, and obtain the inclination information and the distance information of each of the semiconductor chip 2 and the substrate 3 using the measuring apparatus 500. The controller 700 may perform a control operation for correcting a position and a posture (i.e., a positional relationship between the semiconductor chip 2 and the substrate 3) of each of the semiconductor chip 2 and the substrate 3 based on the images and information obtained by using the camera 321 and the measuring apparatus 500.

In example embodiments, the controller 700 may obtain an image of the semiconductor chip 2 and an image of the substrate 3 while the bonding head 310 is holding the semiconductor chip 2. The image of the semiconductor chip 2 may be obtained by capturing the semiconductor chip 2 by the camera 321 through the optical unit 400 and include the fiducial mark 331. The image of the substrate 3 may be obtained by capturing the substrate 3 by the camera 321 and include the fiducial mark 331. The controller 700 may calculate a position correction amount for aligning the semiconductor chip 2 and the substrate 3 based on a positional relationship between the fiducial mark 331 included in the image of the semiconductor chip 2 and the semiconductor chip 2 and a positional relationship between the fiducial mark 331 included in the image of the substrate 3 and the substrate 3. In particular, the controller 700 may calculate the position correction amount for aligning the semiconductor chip 2 and the substrate 3 based on coordinates of a representative point of the semiconductor chip 2 and coordinates of a representative point of the substrate 3. The representative point of the semiconductor chip 2 may be determined by using the fiducial mark 331 as a fiducial point (or a reference point) in the image of the semiconductor chip 2, and the representative point of the substrate 3 may be determined by using the fiducial mark 331 as a fiducial point (or a reference point) in the image of the substrate 3.

Figure 11:
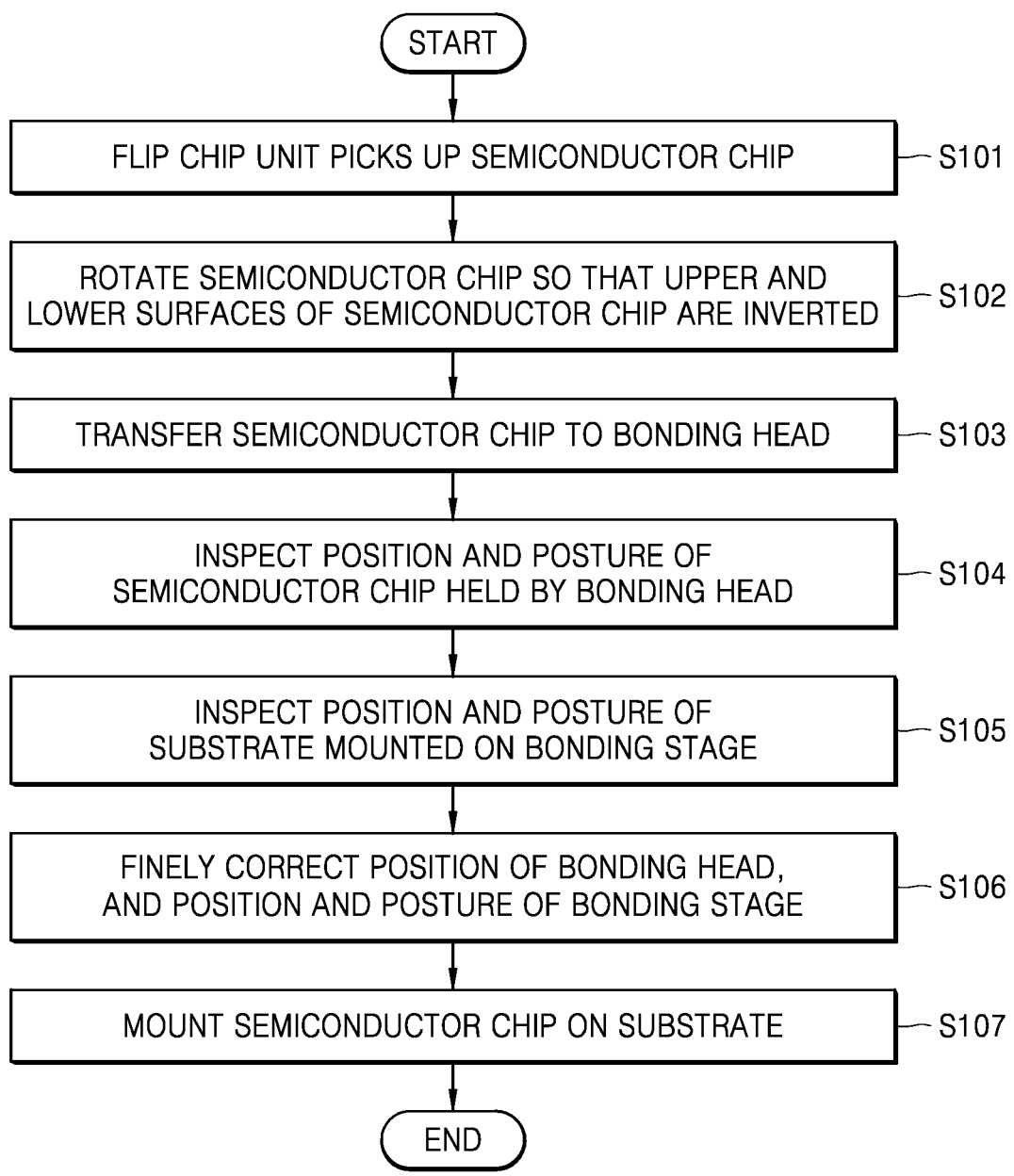
FIG. 11 is a flowchart illustrating a mounting method performed via an apparatus for manufacturing a semiconductor device according to example embodiments of the inventive concept.

FIG. 11 is a flowchart illustrating a mounting method performed via an apparatus for manufacturing a semiconductor device according to example embodiments of the inventive concept. The flowchart of FIG. 11 shows one cycle from pickup of the semiconductor chip to completion of bonding between a semiconductor chip and a substrate. Hereinafter, a mounting method using an apparatus for manufacturing a semiconductor device according to example embodiments will be described with reference to FIG. 11 together with FIGS. 1 to 10.

First, in S101, the flip chip unit 200 picks up the semiconductor chip 2. For example, the flip chip unit 200 picks up the semiconductor chip 2, which is formed by cutting a semiconductor wafer, after moving to a wafer stage on which the semiconductor wafer is mounted, wherein the semiconductor wafer has semiconductor elements formed thereon.

Then, in S102, the flip chip unit 200 rotates the semiconductor chip 2 such that upper and lower surfaces of the semiconductor chip 2 are inverted. For example, the flip chip unit 200 rotates the semiconductor chip 2 by 180 degrees so that the upper and lower surfaces of the semiconductor chip 2, which is picked up, are inverted.

Next, in S103, the flip chip unit 200 transfers the semiconductor chip 2 to the bonding head 310.

For example, in operation S103, the Y-axis slider 301 of the chip carrying unit 300 is moved in the Y-axis direction, and the bonding head 310 is stopped at a position above the flip chip unit 200. The flip chip unit 200 transfers, to the bonding head 310, the semiconductor chip 2 which is picked up and inverted. The bonding head 310 receives the semiconductor chip 2 and adsorbs to hold the semiconductor chip 2.

Then, in S104, a position and a posture of the semiconductor chip 2 held by the bonding head 310 are inspected.

For example, in operation S104, the Y-axis slider 301 of the chip carrying unit 300 is moved in the Y-axis direction, and the bonding head 310 and the vision head 320 are stopped at a certain position above the optical unit 400. That is, the Y-axis slider 301 moves until the bonding head 310 is aligned with the first opening 402*a* of the optical unit 400 and the vision head 320 is aligned with the second opening 402*b* of the optical unit 400. At this time, a position of the chip carrying unit 300 in the Y-axis direction (that is, positions of the bonding head 310 and the vision head 320 in the Y-axis direction) may be referred to as a "semiconductor chip capturing position", and a state of the bonding head 310 and the vision head 320 in the semiconductor chip capturing position may be referred to as a "semiconductor chip capturing state". In the semiconductor chip capturing position, the camera 321 of the vision head 320 captures, through the optical unit 400, an image of the bottom surface (that is, the mounting surface of the semiconductor chip 2) of the semiconductor chip 2 held by the bonding head 310. The controller 700 obtains a position of the semiconductor chip 2 or a rotation angle around a Z-axis from the captured image of the semiconductor chip 2. An error which may occur due to positional deviation of the camera 321 may be removed by using a distance from the fiducial mark 331 reflected in the field of view of the camera 321 in an operation of obtaining the position of the semiconductor chip 2 or the rotation angle around the Z-axis from the captured image of the semiconductor chip 2.

In addition, in operation S104, the measuring apparatus 500 obtains an inclination angle of the semiconductor chip 2. For example, after moving the chip carrying unit 300 to the semiconductor chip capturing position and capturing the image of the semiconductor chip 2, the Y-axis slider 501 of the measuring apparatus 500 is moved in the Y-axis direction and stopped at a certain position near the bonding head 310. That is, the Y-axis slider 501 moves until an end portion of the measurement unit 502 of the measuring apparatus 500 is positioned between the semiconductor chip 2 and the optical unit 400. The measuring apparatus 500 measures the inclination angle of the semiconductor chip 2 by irradiating a laser beam upward from the measurement unit 502 to the bottom surface of the semiconductor chip 2 and receiving a reflected laser beam.

Then, in S105, a position and a posture of the substrate 3 mounted on the bonding stage 600 are inspected.

For example, in operation S105, the Y-axis slider 301 of the chip carrying unit 300 is moved in the Y-axis direction, the bonding stage 600 is moved in the X-axis direction, and the bonding head 310 and the vision head 320 are stopped at a certain position above the bonding stage 600. That is, the bonding head 310 and the bonding stage 600 are moved so that the semiconductor chip 2 held by the bonding head 310 and the substrate 3 on the bonding stage 600 are side by side on the Z-axis. When the semiconductor chip 2 held by the bonding head 310 and the substrate 3 on the bonding stage 600 are arranged side by side on the Z-axis, a position of the chip carrying unit 300 in the Y-axis direction (or positions of the bonding head 310 and the vision head 320 in the Y-axis direction) may be referred to as a "substrate capturing position", and a state of the bonding head 310 and the vision head 320 in the substrate capturing position may be referred to as a "substrate capturing state". In the substrate capturing position, the camera 321 of the vision head 320 captures an image of a surface (mounting surface) of the substrate 3 on the bonding stage 600. The controller 700 obtains a position of the substrate 3 or a rotation angle around the Z-axis from the captured image of the substrate 3. An error which may occur due to positional deviation of the camera 321 may be removed by using a distance from the fiducial mark 331 reflected in the field of view of the camera 321 in an operation of obtaining the position of the substrate 3 or the rotation angle around the Z-axis from the image of the substrate 3, which is captured.

In addition, in operation S105, the measuring apparatus 500 obtains an inclination angle of the substrate 3. For example, after moving the chip carrying unit 300 to the substrate capturing position and capturing the image of the substrate 3, the Y-axis slider 501 of the measuring apparatus 500 is moved in the Y-axis direction and stopped at a certain position above the bonding stage 600. That is, the Y-axis slider 501 moves until the end portion of the measurement unit 502 of the measuring apparatus 500 is positioned between the semiconductor chip 2 and the substrate 3. The measuring apparatus 500 measures the inclination angle of the substrate 3 by irradiating a laser beam downward from the measurement unit 502 to the surface of the substrate 3 and receiving a reflected laser beam.

Then, in S106, a position of the bonding head 310, and a position and a posture of the bonding stage 600 are finely corrected. The controller 700 calculates a correction amount of the positions and postures of the semiconductor chip 2 and the substrate 3 based on the inspected position and posture of the semiconductor chip 2 and the position and posture of the substrate 3. The position of the bonding head 310, and the position and posture of the bonding stage 600 may be finely corrected based on the calculated correction amount. Accordingly, the positions and postures of the semiconductor chip 2 and the substrate 3 may be finely corrected such that the semiconductor chip 2 and the substrate 3 are aligned with each other.

Last, in S107, the semiconductor chip 2 is mounted on the substrate 3. For example, after the positions and postures of the semiconductor chip 2 and the substrate 3 are corrected, the bonding head 310 moves the semiconductor chip 2 in the lower side of the Z-axis direction (or downward) and bonds the semiconductor chip 2 on the substrate 3 by applying an appropriate pressure. In addition, appropriate heat may be applied to the semiconductor chip 2 and the substrate 3 through the bonding stage 600 such that the semiconductor chip 2 is firmly bonded to the substrate 3.

Figure 12:
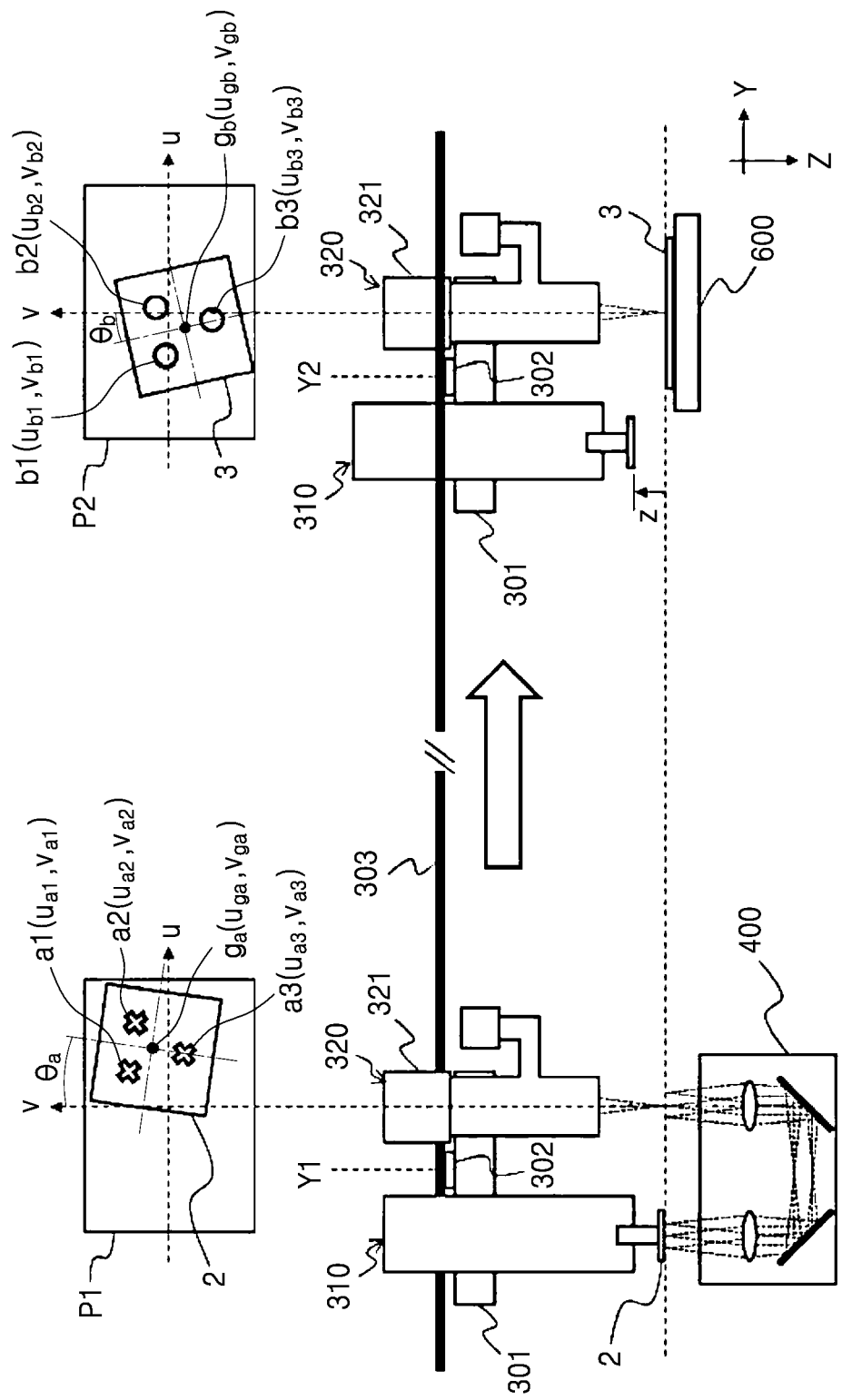
FIG. 12 is a diagram for explaining an example of calculating positions of a semiconductor chip and a substrate in a mounting method performed via an apparatus for manufacturing a semiconductor device.
Figure 13:
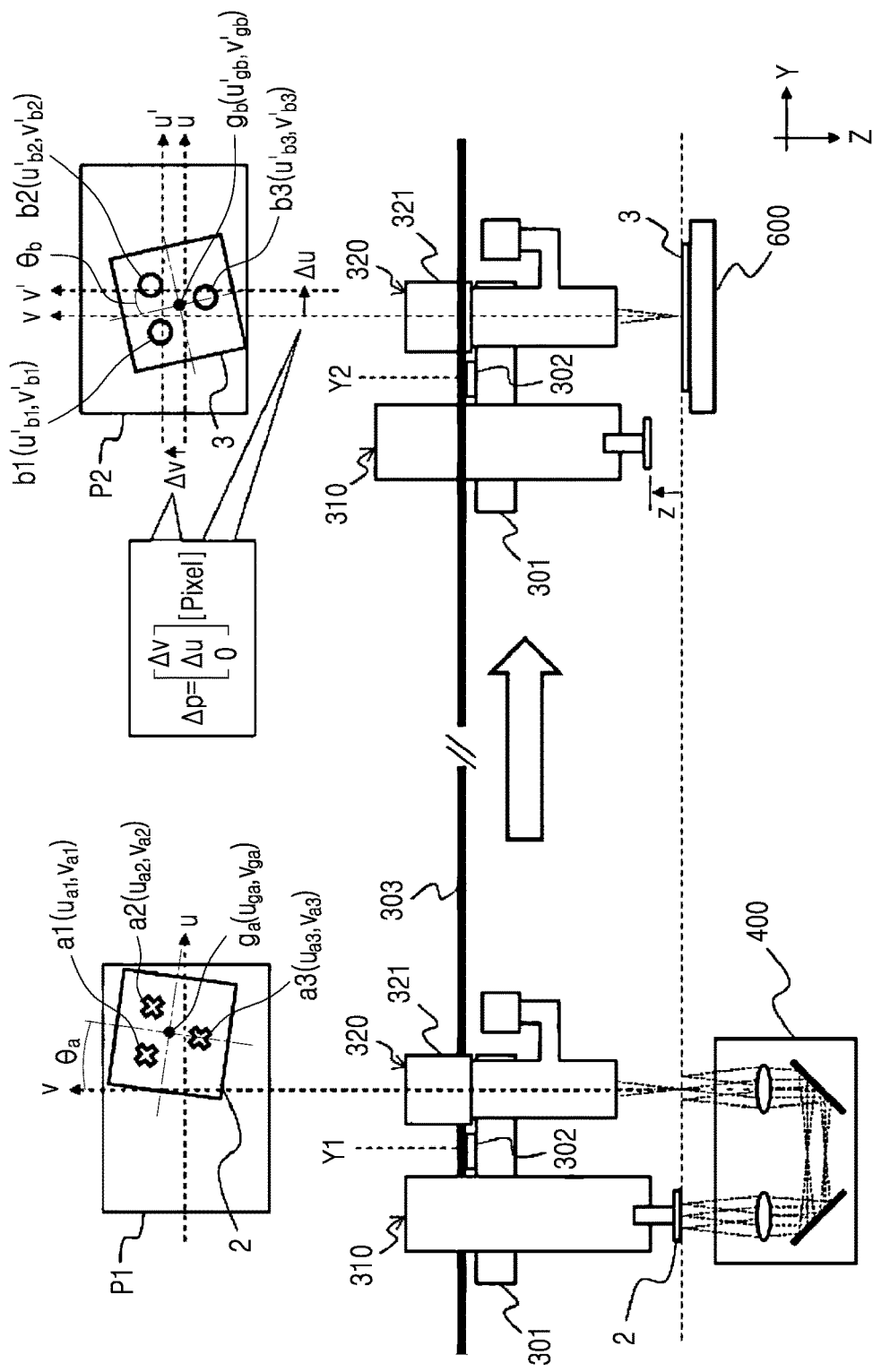
FIG. 13 is a diagram for explaining an example of calculating positions of a semiconductor chip and a substrate in a mounting method performed via an apparatus for manufacturing a semiconductor device.
Figure 14:
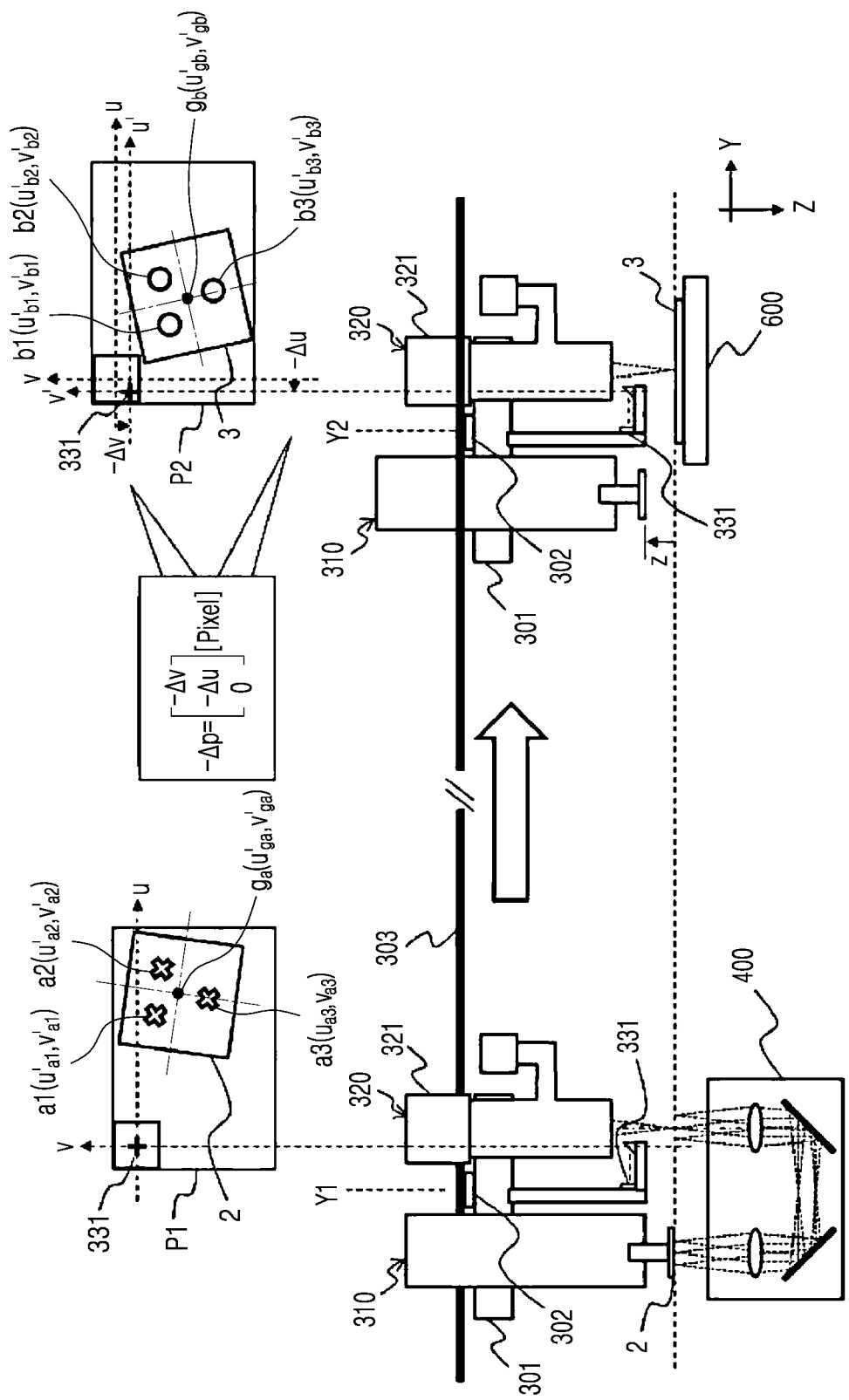
FIG. 14 is a diagram for explaining an example of calculating positions of a semiconductor chip and a substrate in a mounting method performed via an apparatus for manufacturing a semiconductor device.

FIGS. 12 to 14 are each a diagram for explaining an example of calculating positions of a semiconductor chip and a substrate in a mounting method using an apparatus for manufacturing a semiconductor device.

Hereinafter, a position calculation algorithm for correcting the positions of the semiconductor chip 2 and the substrate 3, as a particular example of operation S106 of FIG. 11, will be described with reference to FIGS. 12 to 14 together with FIGS. 1 to 10. For example, the position calculation algorithm is executed by the controller 700. A position calculation algorithm in an example without the fiducial mark 331 will be described with reference to FIGS. 12 and 13, and a position calculation algorithm in an example with the fiducial mark 331 will be described with reference to FIG. 14. In addition, any example described below is applicable to the apparatus 1. In the example in which the reference mark 331 is not provided, the position detection process is performed with only one camera, so that errors due to a plurality of cameras can be removed. Also, in the example in which the fiducial mark 331 is provided, an error due to positional deviation of one camera may be further reduced.

In the following description, the following variables are used.

$a_i$ is a i-th representative point on the semiconductor chip 2. Image coordinates of $a_i$ are $(u_{ai}, v_{ai})$ [pixel]. Here, for simplicity of explanation, i=1, 2, 3, but more points may be used as representative points. In addition, a representative point of the semiconductor chip 2 is, for example, a terminal of the semiconductor chip 2, a conductive pad of the semiconductor chip 2, a certain mark, or the like.

$g_a$ is a central position of the representative points of the semiconductor chip 2. $g_a$ is calculated from coordinates of a1, a2, and a3. Image coordinates $g_a$ of are $(u_{ga}, v_{ga})$ [pixel].

$\theta_a$ is a rotation angle of the semiconductor chip 2. $\theta_a$ is calculated from coordinates of a1, a2, and a3.

$b_i$ is a i-th representative point on the substrate 3. Image coordinates of $b_i$ are $(u_{bi}, v_{bi})$ [pixel]. Here, for simplicity of explanation, i=1, 2, 3, but more points may be used as representative points. In addition, a representative point of the substrate 3 is a point corresponding to a representative point of the substrate 3, and for example, is a terminal of the substrate 3, a conductive pad of the substrate 3, a certain mark, or the like.

$g_b$ is a central position of the representative points of the substrate 3. $g_b$ is calculated from positions of b1, b2, and b3. Image coordinates of $g_b$ are $(u_{gb}, v_{gb})$ [pixel].

$\theta_b$ is a rotation angle of the substrate 3. $\theta_b$ is calculated from coordinates of b1, b2, and b3.

z is a distance [mm] of the semiconductor chip 2 measured based on the surface of the substrate 3 in the Z-axis direction in the substrate capturing state.

βv is an optical magnification [mm/pixel] of the vision head 320.

βr is an optical magnification [times] of the optical unit 400.

FIG. 12 shows a position alignment example in an ideal case where there is no positional deviation of the camera 321 in the example without the fiducial mark 331. In the example without the fiducial mark 331, the bonding head 310 and the vision head 320 fixed to the Y-axis slider 301 move in the Y-axis direction at the same time.

A purpose of the position calculation algorithm is to position and align the semiconductor chip 2 and the substrate 3 with high precision. Here, for convenience of explanation, a representative point $b_i$ (i=1, 2, 3) on the substrate 3 and a corresponding representative point $a_i$ (i=1, 2, 3) on the semiconductor chip 2 are aligned with high precision.

In the position calculation algorithm, first, in the semiconductor chip capturing state (position of Y1) on the left side of FIG. 12, the camera 321 captures the image of the semiconductor chip 2 through the optical unit 400 and obtains a first image P1 of the semiconductor chip 2, which is captured. Image coordinates of $a_i$ are obtained from the first image P1 of the semiconductor chip 2. A central position $g_a$ (herein, also referred to as central positions of a1, a2, and a3) of a representative point of the semiconductor chip 2, and a rotation angle $\theta_a$ are calculated from the obtained image coordinates of $a_i$.

After capturing the image of the semiconductor chip 2, the bonding head 310 moves the semiconductor chip 2 in the upper side of the Z-axis direction (or upward). Next, the bonding head 310 and the vision head 320 are moved together in the Y-axis direction and the bonding stage 600 is moved in the X-axis direction so that the mounting position of the substrate 3 (that is, a position of the substrate 3 where the semiconductor chip 2 is to be mounted) is captured in the field of view of the camera 321. The mounting position where the semiconductor chip 2 is mounted on the substrate 3 is a programmed design value, and the bonding stage 600 is movable with such precision that the mounting position on the substrate 3 is included in the field of view of the camera 321. In the substrate capturing state (position of Y2) on the right side of FIG. 12, the camera 321 captures the image of the substrate 3 and obtains a second image P2 of the substrate 3. Image coordinates of $b_i$ of are obtained from the second image P2 of the substrate 3. A central position $g_b$ of a representative point of the substrate 3, and the rotation angle $\theta_b$ are calculated from the obtained image coordinates of $b_i$.

In addition, $y_{offset}$ [mm] corresponding to a distance in the Y-axis direction between a central axis of the bonding head 310 and a central axis of the vision head 320 is determined at the time of setting the apparatus 1, and a distance z [mm] of the semiconductor chip 2 measured based on the surface of the substrate 3 in the Z-axis direction is considered to be predetermined.

Next, a movement amount (correction amount) for alignment between the semiconductor chip 2 and the substrate 3 is calculated, from information $a_i$, $g_a$, $b_i$, $g_b$, $\theta_a$, $\theta_b$, $y_{offset}$, and z, as follows together.

The representative point of the semiconductor chip 2 and the representative point of the substrate 3 may be expressed by the following Equation 1.

[Equation 1]

$$\begin{bmatrix} r_{bi} - r_{gb} \\ 1 \end{bmatrix} = \begin{bmatrix} R & T \\ 0 & 1 \end{bmatrix} \begin{bmatrix} r_{ai} - r_{ga} \\ 1 \end{bmatrix} \quad i = 1, 2, 3 \quad (1)$$

Here, $r_{ai}$ is a three-dimensional space coordinate of the i-th representative point of the semiconductor chip 2. $r_{ga}$ is a three-dimensional space coordinate of a center coordinate of representative points of the semiconductor chip 2. $r_{bi}$ is a three-dimensional space coordinate of the i-th representative point on the substrate 3. $r_{gb}$ is a three-dimensional space coordinate of a center coordinate of representative points of the substrate 3.

When a center of the field of view of the camera 321 in the substrate capturing state is taken as a fiducial point, $r_{ai}$ becomes the following Equation 2.

[Equation 2]

$$r_{ai} = \begin{bmatrix} x_{ai} \\ y_{ai} \\ z_{ai} \end{bmatrix} = \begin{bmatrix} \beta_v v_{ai} / \beta_r \\ \beta_v u_{ai} / \beta_r - y_{offset} \\ z \end{bmatrix} \quad (2)$$

Similarly, $r_{bi}$ may be expressed by Equation 3 below.

[Equation 3]

$$r_{bi} = \begin{bmatrix} x_{bi} \\ y_{bi} \\ z_{bi} \end{bmatrix} = \begin{bmatrix} \beta_v v_{bi} \\ \beta_v u_{bi} \\ 0 \end{bmatrix} \quad (3)$$

When a rotation amount for correcting the posture of the semiconductor chip 2 is assumed as R, R is obtained by the following Equation 4.

[Equation 4]

$$R = \begin{bmatrix} \cos\theta & -\sin\theta & 0 \\ \sin\theta & \cos\theta & 0 \\ 0 & 0 & 1 \end{bmatrix}, \theta = \theta_b - \theta_a \quad (4)$$

When an amount by which a position of the semiconductor chip 2 is moved in parallel (that is, a movement in the X-axis direction, a movement in the Y-axis direction, and a movement in the Z-axis direction) is assumed as T, T is obtained by the following Equation 5.

[Equation 5]

$$T = \begin{bmatrix} T_x \\ T_y \\ T_z \end{bmatrix} = \begin{bmatrix} (v_{gb} - v_{ga}/\beta_r)\beta_v \\ (u_{gb} - u_{ga}/\beta_r)\beta_v + y_{offset} \\ -z \end{bmatrix} = r_{gb} - r_{ga} \quad (5)$$

The following movement amount and rotation angle (correction amount) are obtained from Equations 4 and 5.

A movement amount of the Y-axis slider 301 in the Y-axis direction is $T_y$ [mm].

A movement amount of the bonding stage 600 in the X-axis direction is $T_x$ [mm].

A movement amount of the bonding head 310 in the Z-axis direction is $T_z$ [mm].

A rotation angle of the semiconductor chip 2 is $\theta$ [mm].

Position alignment between the semiconductor chip 2 and the substrate 3 is performed by instructing the calculated movement amount and rotation angle to the apparatus 1 (that is, from the controller 700 to each component of the apparatus 1).

FIG. 13 shows a position alignment example in a case where a positional deviation of the camera 321 exists in the example without the fiducial mark 331. Similar to FIG. 12, the bonding head 310 and the vision head 320 which are fixed to the Y-axis slider 301 are simultaneously moved in the Y-axis direction, and a movement amount (e.g., a movement amount of the Y-axis slider 301 in the Y-axis direction, a movement amount of the bonding stage 600 in the X-axis direction, and a movement amount of the bonding head 310 in the Z-axis direction) is calculated. Here, it is assumed that a light receiving device inside the camera 321 causes a slight positional deviation between the semiconductor chip capturing state (the position of Y1) and the substrate capturing state (the position of Y2). That is, the slight positional deviation caused by the light receiving device inside the camera 321 does not occur in the semiconductor chip capturing state, but occurs only in the substrate capturing state. A case in which the light receiving device provided in the camera 321 causes a slight positional deviation will be described below, but it should be noted that the following description may be applied substantially the same or similarly even when positional deviation entirely occurs in the vision head 320.

First, a positional deviation amount of the light receiving device of the camera 321 is expressed by Equation 6. In addition, the positional deviation of the light receiving device of the camera 321 is not limited only to a parallel movement, and although rotation is included, herein, only a parallel movement component is used for simplified description.

[Equation 6]

$$\Delta p = \begin{bmatrix} \Delta v \\ \Delta u \\ 0 \end{bmatrix} \text{[pixel]} \quad (6)$$

At this time, because the image coordinates of the representative point $b_i$ on the substrate 3, which is calculated from the second image P2 of the substrate 3, include positional deviation as an error, the above Equation 3 becomes the following Equation 7.

[Equation 7]

$$r'_{bi} = \begin{bmatrix} x'_{bi} \\ y'_{bi} \\ z'_{bi} \end{bmatrix} = \begin{bmatrix} \beta_v v'_{b1} \\ \beta_v u'_{b1} \\ 0 \end{bmatrix} = \begin{bmatrix} \beta_v(v_{bi} - \Delta v) \\ \beta_v(u_{bi} - \Delta u) \\ 0 \end{bmatrix} = r_{bi} - \Delta r \quad (7)$$

That is, an error is added by $-\Delta r$ for a real value $r_{bi}$. Here, $\Delta r$ is a conversion of a positional deviation amount $\Delta p$ of the light receiving device in a unit of mm, and is expressed by the following Equation 8.

[Equation 8]

$$\Delta r = \begin{bmatrix} \Delta x \\ \Delta y \\ \Delta z \end{bmatrix} = \begin{bmatrix} \beta_v \Delta v \\ \beta_v \Delta u \\ 0 \end{bmatrix} = \beta_v \Delta p \quad (8)$$

T' calculated from the second image P2 of the substrate 3 which includes positional deviation becomes the following Equation 9 based on the above Equation 5.

[Equation 9]

$$T' = \begin{bmatrix} T'_x \\ T'_y \\ T'_z \end{bmatrix} = \begin{bmatrix} (v'_{gb} - v_{ga}/\beta_r)\beta_v \\ (u'_{gb} - u_{ga}/\beta_r)\beta_v + y_{offset} \\ -z \end{bmatrix} = T - \Delta r \quad (9)$$

As described above, there is a problem in that the positional deviation amount of the light receiving device of the camera 321 is applied to a movement amount of the semiconductor chip 2 as an error. To eliminate this error, a movement amount $\Delta r$ of the light receiving device of the camera 321 needs to be known. In this example, as shown in Equation 7, an exact position of the substrate 3 and the positional deviation amount of the light receiving device of the camera 321 may not be separated.

FIG. 14 shows a position alignment example in a case where a positional deviation of the camera 321 exists in the example with the fiducial mark 331. In the example with the fiducial mark 331, the bonding head 310, the vision head 320, and the fiducial mark 331 which are fixed to the Y-axis slider 301 are simultaneously moved in the Y-axis direction, and a movement amount (e.g., the movement amount of the Y-axis slider 301 in the Y-axis direction, the movement amount of the bonding stage 600 in the X-axis direction, and the movement amount of the bonding head 310 in the Z-axis direction) is calculated.

In embodiments, the fiducial mark 331 is arranged to always be reflected in the field of view of the camera 321. The image of the semiconductor chip 2 is captured in the semiconductor chip capturing state (the position of Y1), and the image coordinates of the representative point $a_i$ of the semiconductor chip 2 is obtained from the first image P1 of the semiconductor chip 2. At this time, a center of an image is not taken as a fiducial point, and the fiducial mark 331 shown in the first image P1 is taken as an origin.

It is assumed that the light receiving device inside the camera 321 causes a positional deviation by $\Delta p$ [pixel] between the semiconductor chip capturing state (the position of Y1) and the substrate capturing state (the position of Y2). That is, the positional deviation $\Delta p$ caused by the light receiving device inside the camera 321 does not occur in the semiconductor chip capturing state, but occurs only in the substrate capturing state. In this case, in the second image P2 of the substrate 3, which is obtained by capturing the substrate 3 in the substrate capturing state, the fiducial mark 331 is shown by moving $-\Delta p$. Similarly, in the second image P2 of the substrate 3, the substrate 3 is also shown by moving $-\Delta p$ from a real position.

When the image coordinates of the representative point $b_i$ on the substrate 3 are obtained without using the fiducial mark 331 as a fiducial point, the movement amount of the light receiving device of the camera 321 is applied as an error as shown in Equations 7 and 9. However, when the image coordinates of the representative point $b_i$ of the substrate 3 are obtained with the fiducial mark 331 as a fiducial point, the movement amount $\Delta p$ of the light receiving is not included as shown in Equations 3 and 5. In addition, as shown in the above Equation 7, the exact position of the substrate 3 and the positional deviation amount of the light receiving device of the camera 321 may be separated by knowing a change in image coordinates of the fiducial mark 331.

According to example embodiments, as an operation from the pick-up of the semiconductor chip 2 to the bonding between the semiconductor chip 2 and the substrate 3 is performed by one camera 321, an error factor due to the camera 321 may be reduced, and mounting precision may be achieved at high precision (e.g., sub-μm). In addition, because there is only one camera 321, the number of members of the apparatus 1 may be reduced and the manufacturing cost of the apparatus 1 may be reduced.

In example embodiments, high-precision mounting using one camera 321 may be achieved by adopting the following two methods.

First, to detect a position error of the semiconductor chip 2 picked up by the bonding head 310, the optical unit 400 for observing the bottom surface of the semiconductor chip 2 is provided.

Because the semiconductor chip 2 is held by the bonding head 310, an image thereof needs to be captured from the lower side toward the upper side. In general, an additional camera for performing capturing from the lower side to the upper side has been provided. However, in the present embodiments, the camera 321 is arranged to perform capturing from the upper side to the lower side, but the optical unit 400 for capturing the bottom surface of the semiconductor chip 2 is added. The optical unit 400 may perform a function of transmitting an image of the bottom surface of the semiconductor chip 2 to a capturing position of the camera 321. Accordingly, the camera 321 is arranged in a direction from the upper side toward the lower side, but the image of the bottom surface of the semiconductor chip 2 may be captured through the optical unit 400. Also, when the image of the substrate 3 is captured to detect a position error of the substrate 3, the camera 321 captures from the upper side toward the lower side, and thus the image of the substrate 3 may be directly captured without the optical unit 400.

Second, to correct the positional deviation of the camera 321, the fiducial mark 331 which is always reflected in the field of view of the camera 321 is provided.

The camera 321 is an important element for detecting the position error of the semiconductor chip 2 or the substrate 3, and the positional deviation of the camera 321 is directly related to a mounting error. However, the camera 321 may receive mechanical stress in an operation of performing a Y-axis driving, and the light receiving device such as a CCD or a CMOS inside the camera 321 may receive thermal stress due to heat generation. To achieve high-precision mounting, it is needed to monitor the position deviation of the camera 321 and reflect the same in the correction of a mounting position. In embodiments, the fiducial mark 331 in which the image thereof is always able to be captured is provided in the field of view of the camera 321. The fiducial mark 331 is arranged so that a relative position thereof to the camera 321 and the Y-axis linear encoder 302 that detects Y-axis coordinates of the bonding head 310 does not change. When a position error of the semiconductor chip 2 is detected and when a position error of the substrate 3 is detected, an error is managed based on a relative position to the fiducial mark 331, so that an effect due to the positional deviation of the camera 321 may be excluded even when the position deviation occurs in the camera 321.

Figure 15:
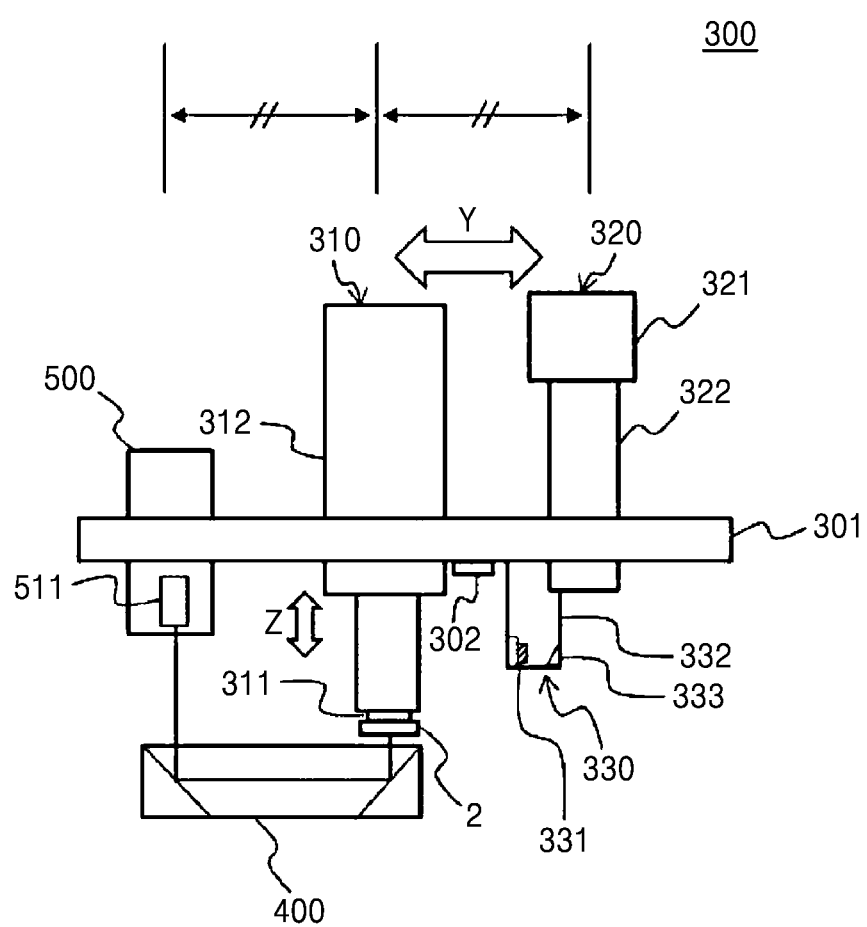
FIG. 15 is a configuration diagram of a portion of an apparatus for manufacturing a semiconductor device according to example embodiments of the inventive concept.

FIG. 15 is a configuration diagram of a portion of an apparatus for manufacturing a semiconductor device according to example embodiments of the inventive concept.

The apparatus for manufacturing a semiconductor device shown in FIG. 15 may be substantially the same as or similar to the apparatus 1 for manufacturing the semiconductor device described with reference to FIGS. 1 to 14 except for a configuration of the measuring apparatus 500. Hereinafter, the apparatus for manufacturing a semiconductor device shown in FIG. 15 will be described with a focus on differences from the apparatus 1 described with reference to FIGS. 1 to 14.

Referring to FIG. 15, the chip carrying unit 300 may include the measuring apparatus 500. The chip carrying unit 300 may include the Y-axis slider 301, the bonding head 310, the vision head 320, and the fiducial mark arrangement unit 330, and may further include the measuring apparatus 500.

The measuring apparatus 500 may be fixed to the Y-axis slider 301 together with the bonding head 310 and the vision head 320, and may be integrated with the bonding head 310 and the vision head 320 to move in the Y-axis direction. A distance from the bonding head 310 to the vision head 320 (or the camera 321) in the Y-axis direction and a distance from the bonding head 310 to the measuring apparatus 500 in the Y-axis direction may be the same. A positional relationship between the bonding head 310 and the measuring apparatus 500 may correspond to positions of the first opening 402a (FIG. 6) and the second opening 402b (FIG. 6) or positions of the first lens 403a (FIG. 7) and the second lens 403b (FIG. 7) of the optical unit 400. For example, when the measuring apparatus 500 is aligned with an optical axis of the first opening 402a (FIG. 6) or the first lens 403a (FIG. 7) of the optical unit 400 in the Z-axis direction, the bonding head 310 may be aligned with an optical axis of the second opening 402b (FIG. 6) or the second lens 403b (FIG. 7) of the optical unit 400 in the Z-axis direction. The measuring apparatus 500 may be spaced apart from the vision head 320 with the bonding head 310 therebetween, and the distance between the measuring apparatus 500 and the bonding head 310 in the Y-axis direction may be equal to an optical axis pitch of the optical unit 400. Accordingly, the measuring apparatus 500 may measure an inclination or distance information in the Z-axis direction of the semiconductor chip 2 held by the bonding head 310 through the optical unit 400.

The measuring apparatus 500 measures the semiconductor chip 2 and the substrate 3 (FIG. 1) by using one light emitting and light receiving device 511.

In a case where the semiconductor chip 2 is measured, when a light emitting device of the light emitting and light receiving device 511 emits a laser beam in the Z-axis direction, the laser beam emitted by the light emitting device of the light emitting and light receiving device 511 reaches the semiconductor chip 2 through the optical unit 400, and reflected light reflected by the semiconductor chip 2 is incident on a light receiving device of the light emitting and light receiving device 511 through the optical unit 400. Through the reflected light reflected by the semiconductor chip 2, an inclination angle or distance information in the Z-axis direction of the semiconductor chip 2 may be obtained. When the substrate 3 is measured, the optical unit 400 is not needed, and the measuring apparatus 500 directly measures the surface of the substrate 3 by using a laser beam emitted in the Z-axis direction. The controller 700 calculates the correction amounts of the semiconductor chip 2 and the substrate 3 by using the inclination information and the distance information of the semiconductor chip 2, which are measured by the measuring apparatus 500 through the optical unit 400, and the inclination information and the distance information of the substrate 3, which are directly measured by the measuring apparatus 500.

The measuring apparatus 500 is driven integrally with the bonding head 310 and the vision head 320, and the semiconductor chip 2 may be measured from the measuring apparatus 500 through the optical unit 400. Accordingly, because the light emitting and light receiving device 511 of the measuring apparatus 500 may be realized as one, the measurement precision of the measuring apparatus 500 may be improved, and the number of members and cost may also be reduced.

Each configuration in the above-described embodiment is configured by hardware, software, or both of hardware and software, and may be configured by one piece of hardware or software, or may be configured by a plurality of pieces of hardware or software. A function (process) of each device may also be implemented by a computer having a CPU, a memory, or the like. For example, a program for performing the method (control method) according to the embodiments may be stored in a storage device, and each function may be implemented by executing the program stored in the storage device in the CPU.

Such a program may be stored and provided to a computer by using various types of non-transitory computer readable media. The non-transitory computer-readable media includes various types of tangible storage media. Examples of the non-transitory computer readable media include magnetic recording media (e.g., flexible disks, magnetic tapes, hard disk drives), magneto-optical recording media (e.g., optical magnetic disks), CD-ROM, compact disc-recordable (CD-R), CD-rewritable (R/W), a semiconductor memory (e.g., mask ROM, programmable ROM (PROM), erasable PROM (EPROM), flash ROM, RAM). In addition, the program may be supplied to the computer by various types of transitory computer readable media. Examples of the transitory computer-readable media include electrical signals, optical signals, and electromagnetic waves. Temporary computer-readable medium may supply the program to the computer through a wired communication path such as an electric wire and optical fiber, or a wireless communication path.

While the inventive concept has been particularly shown and described with reference to embodiments thereof, it will be understood that various changes in form and details may be made therein without departing from the scope of the following claims.

What is claimed is:

1. An apparatus for manufacturing a semiconductor device, the apparatus comprising:
    a bonding head configured to adsorb and hold a mounting component at a pick-up position, to move between the pick-up position and a mounting position, and to mount the mounting component on a substrate that is on a bonding stage;
    a camera configured to move together with the bonding head, to capture an image of the mounting component held by the bonding head, and to capture an image of the substrate that is on the bonding stage;
    an optical system configured to transmit light between the mounting component and the camera so that the image of the mounting component held by the bonding head is captured by the camera;
    a fiducial mark configured to move together with the camera in a capturing range of the camera;
    a controller configured to correct a positional relationship between the mounting component and the substrate based on a first image comprising the fiducial mark and the mounting component and a second image comprising the fiducial mark and the substrate, wherein the first image is obtained by capturing an image of the mounting component by the camera through the optical system, and the second image is obtained by capturing an image of the substrate by the camera; and
    a measuring apparatus configured to move in a moving direction of the bonding head,
    wherein the measuring apparatus is further configured to measure an inclination or a height of the mounting component held by the bonding head through the optical system and to measure an inclination or a height of the substrate.

2. The apparatus for manufacturing a semiconductor device of claim 1, wherein the fiducial mark is at a position spaced apart from the camera by a first distance.

3. The apparatus for manufacturing a semiconductor device of claim 2, wherein the first distance is equal to a focal length of the camera.

4. The apparatus for manufacturing a semiconductor device of claim 1, further comprising:
    a mirror on an optical path of the camera,
    wherein the fiducial mark is in the capturing range of the camera through the mirror.

5. The apparatus for manufacturing a semiconductor device of claim 1, further comprising:
    a linear encoder fixed to the camera and configured to detect a movement distance of the camera,
    wherein a relative position between the fiducial mark and the linear encoder is constant.

6. The apparatus for manufacturing a semiconductor device of claim 1, further comprising:
    an auxiliary lighting device configured to illuminate the fiducial mark.

7. The apparatus for manufacturing a semiconductor device of claim 1, wherein the controller is further configured to correct the positional relationship between the mounting component and the substrate based on a positional relationship between the fiducial mark and the mounting component in the first image and a positional relationship between the fiducial mark and the substrate in the second image.

8. The apparatus for manufacturing a semiconductor device of claim 7, wherein the controller is further configured to correct the positional relationship between the mounting component and the substrate based on coordinates of a representative point of the mounting component obtained by using the fiducial mark as a fiducial point in the first image and coordinates of a representative point of the substrate obtained by using the fiducial mark as a fiducial point in the second image.

9. The apparatus for manufacturing a semiconductor device of claim 1, wherein the camera is arranged to capture images in a same direction as a mounting direction of the bonding head, and
    the optical system adjusts an optical path of the camera so that the camera captures an image of a surface of the mounting component, wherein the surface is opposite to an adsorption surface of the mounting component, and the adsorption surface is in contact with the bonding head.

10. The apparatus for manufacturing a semiconductor device of claim 9, wherein the optical system comprises a first input and output unit and a second input and output unit through which light is input and output, and
    while the camera captures the mounting component through the optical system, a position of the bonding head is aligned with the first input and output unit, and a position of the camera is aligned with the second input and output unit.

11. The apparatus for manufacturing a semiconductor device of claim 1, wherein the optical system comprises a telecentric optical system.

12. The apparatus for manufacturing a semiconductor device of claim 1, wherein the optical system has a variable optical magnification.

13. The apparatus for manufacturing a semiconductor device of claim 1, further comprising:

an illumination light source configured to illuminate the mounting component while the image of the mounting component by the camera through the optical system is captured.

14. The apparatus for manufacturing a semiconductor device of claim 13, wherein the optical system further comprises an auxiliary light source configured to illuminate the mounting component.

15. The apparatus for manufacturing a semiconductor device of claim 14, wherein optical system further comprises a beam splitter, and the auxiliary light source is configured to illuminate the mounting component through the beam splitter.

16. The apparatus for manufacturing a semiconductor device of claim 1, wherein the optical system comprises a first opening and a second opening through which light is configured to be input and output,
a position of the measuring apparatus is configured to be aligned with the first opening, and a position of the bonding head is configured to be aligned with the second opening.

17. The apparatus for manufacturing a semiconductor device of claim 16, wherein, while the bonding head moves in a first direction between the pick-up position and the mounting position, a distance between the bonding head and the camera in the first direction and a distance between the bonding head and the measuring apparatus in the first direction are the same.

18. An apparatus for manufacturing a semiconductor device, the apparatus comprising:
a bonding head configured to adsorb and hold a semiconductor chip at a pick-up position, to move between the pick-up position and a mounting position, and to mount the semiconductor chip on a substrate that is on a bonding stage;
a camera configured to move together with the bonding head, to capture an image of the semiconductor chip held by the bonding head, and to capture an image of the substrate that is on the bonding stage;
an optical system configured to transmit light between the semiconductor chip and the camera so that the image of the semiconductor chip held by the bonding head is captured by the camera; and
a controller configured to correct a positional relationship between the semiconductor chip and the substrate based on a first image of the semiconductor chip and a second image of the substrate, wherein the first image is obtained by capturing an image of the semiconductor chip by the camera through the optical system, and the second image is obtained by capturing an image of the substrate directly by the camera,
wherein the optical system comprises:
a case; and
first and second openings on an upper surface of the case;
one of the first and second openings is for incident light and the other of the first and second openings is for emitted light, and
while the camera captures the semiconductor chip through the optical system, the bonding head is above and vertically overlaps the first opening, and the camera is above and vertically overlaps the second opening.

19. The apparatus for manufacturing a semiconductor device of claim 18, further comprising:
a measuring apparatus configured to move in a moving direction of the bonding head,
wherein the measuring apparatus is further configured to measure an inclination or a height of the semiconductor chip held by the bonding head through the optical system and to measure an inclination or a height of the substrate.

20. An apparatus for manufacturing a semiconductor device, the apparatus comprising:
a bonding head configured to adsorb and hold a mounting component at a pick-up position, to move between the pick-up position and a mounting position, and to mount the mounting component on a substrate on a bonding stage;
a camera configured to move together with the bonding head, to capture an image of the mounting component held by the bonding head, and to capture an image of the substrate on the bonding stage;
an optical system configured to transmit light between the mounting component and the camera so that the image of the mounting component held by the bonding head is captured by the camera;
a fiducial mark configured to move together with the camera and in a capturing range of the camera when the camera captures the image of the mounting component held by the bonding head and when the camera captures the image of the substrate on the bonding stage;
a controller configured to correct a positional relationship between the mounting component and the substrate based on a first image comprising the fiducial mark and the mounting component and a second image comprising the fiducial mark and the substrate, wherein the first image is obtained by capturing an image of the mounting component by the camera through the optical system, and the second image is obtained by capturing an image of the substrate by the camera; and
a linear encoder fixed to the camera and configured to detect a movement distance of the camera,
wherein a relative position between the fiducial mark and the linear encoder is constant.

* * * * *